United States Patent
Han et al.

(10) Patent No.: US 9,202,844 B2
(45) Date of Patent: Dec. 1, 2015

(54) SEMICONDUCTOR DEVICES HAVING BLOCKING LAYERS AND METHODS OF FORMING THE SAME

(71) Applicant: Samsung Electronics Co., Ltd., Suwon-si (KR)

(72) Inventors: Jae-Jong Han, Seoul (KR); Yoon-Goo Kang, Yongin-si (KR); Won-Seok Yoo, Hwaseong-si (KR); Kong-Soo Lee, Hwaseong-si (KR); Han-Jin Lim, Seoul (KR); Seong-Hoon Jeong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/966,423

(22) Filed: Aug. 14, 2013

(65) Prior Publication Data

US 2014/0158964 A1 Jun. 12, 2014

(30) Foreign Application Priority Data

Dec. 6, 2012 (KR) ........................ 10-2012-0141238

(51) Int. Cl.
*H01L 27/24* (2006.01)
*H01L 45/00* (2006.01)

(52) U.S. Cl.
CPC ........ *H01L 27/2409* (2013.01); *H01L 27/2463* (2013.01); *H01L 45/06* (2013.01); *H01L 45/1233* (2013.01); *H01L 45/143* (2013.01); *H01L 45/144* (2013.01)

(58) Field of Classification Search
None
See application file for complete search history.

(56) References Cited

U.S. PATENT DOCUMENTS

| | | | |
|---|---|---|---|
| 5,236,856 A * | 8/1993 | Chan et al. | 438/385 |
| 7,442,602 B2 | 10/2008 | Park et al. | |
| 7,598,112 B2 | 10/2009 | Park et al. | |
| 7,704,788 B2 * | 4/2010 | Youn et al. | 438/102 |
| 8,030,129 B2 | 10/2011 | Jeong et al. | |
| 2001/0002046 A1* | 5/2001 | Reinberg et al. | 257/3 |
| 2004/0217430 A1* | 11/2004 | Chu | 257/410 |
| 2006/0186483 A1* | 8/2006 | Cho et al. | 257/390 |
| 2006/0237756 A1* | 10/2006 | Park et al. | 257/296 |
| 2008/0048293 A1 | 2/2008 | Horii | |
| 2008/0280390 A1* | 11/2008 | Kim et al. | 438/95 |
| 2009/0001343 A1* | 1/2009 | Schricker et al. | 257/4 |
| 2011/0095258 A1* | 4/2011 | Xu et al. | 257/3 |
| 2011/0312126 A1 | 12/2011 | Bae et al. | |
| 2012/0149166 A1 | 6/2012 | Park et al. | |

FOREIGN PATENT DOCUMENTS

| | | |
|---|---|---|
| JP | 2011-114011 | 6/2011 |
| KR | 1020090015719 A | 2/2009 |
| KR | 1020090049270 A | 5/2009 |
| KR | 1020090060593 A | 6/2009 |
| KR | 1020100015105 A | 2/2010 |
| KR | 1020100036450 A | 4/2010 |

* cited by examiner

*Primary Examiner* — Andres Munoz
(74) *Attorney, Agent, or Firm* — Myers Bigel Sibley & Sajovec, P.A.

(57) ABSTRACT

A semiconductor device includes a lower interconnection having second conductivity-type impurities on a substrate having first conductivity-type impurities. A switching device is on the lower interconnection. A first blocking layer is provided between the lower interconnection and the switching device. The first blocking layer includes carbon (C), germanium (Ge), or a combination thereof. A second blocking layer may be provided between the substrate and the lower interconnection.

6 Claims, 35 Drawing Sheets

SEMICONDUCTOR DEVICES HAVING BLOCKING LAYERS AND METHODS OF FORMING THE SAME

CROSS-REFERENCE TO RELATED APPLICATION

This non-provisional patent application claims priority under 35 U.S.C. §119 to Korean Patent Application No. 10-2012-0141238, filed on Dec. 6, 2012, the disclosure of which is hereby incorporated by reference in its entirety.

BACKGROUND

1. Field

Embodiments of the inventive concept relate to semiconductor devices that have one or more blocking layers, and to methods of forming the same.

2. Description of Related Art

In a semiconductor device, such as a phase-change random access memory (PRAM), various methods of reducing the size of a lower interconnection and ensuring current driving capability have been studied.

SUMMARY

Embodiments of the inventive concept provide semiconductor devices having improved word line current driving capability that are favorable for high integration.

Other embodiments of the inventive concept provide methods of forming a semiconductor device having improved word line current driving capability that are favorable for high integration.

The technical objectives of the inventive concept are not limited to the above disclosure; other objectives may become apparent to those of ordinary skill in the art based on the following descriptions.

In accordance with an aspect of the inventive concept, a semiconductor device is provided that includes a substrate having first conductivity-type impurities, a lower interconnection on the substrate and having second conductivity-type impurities, a switching device on the lower interconnection, and a first blocking layer between the lower interconnection and the switching device. The first blocking layer includes carbon, germanium, or a combination thereof.

In some embodiments, the lower interconnection may include a semiconductor layer formed using a selective epitaxial growth (SEG) process or a solid phase epitaxial growth process.

In other embodiments, the first blocking layer may be self-aligned with the lower interconnection and have the same horizontal width as the lower interconnection.

In still other embodiments, the first blocking layer may include a semiconductor layer formed using a selective epitaxial growth (SEG) process or a solid phase epitaxial growth process.

In still other embodiments, the switching device may include a first semiconductor pattern having second conductivity-type impurities that is in direct contact with the first blocking layer, and a second semiconductor pattern on the first semiconductor pattern. A first concentration of the second conductivity-type impurities in the first semiconductor pattern may be lower than a second concentration of second conductivity-type impurities in the lower interconnection.

In still other embodiments, the first blocking layer may have the same horizontal width as the first semiconductor pattern.

In still other embodiments, a second blocking layer may be between the substrate and the lower interconnection. The second blocking layer may include carbon, germanium, or a combination thereof.

In some embodiments, the semiconductor device may further comprise a second blocking layer that includes carbon (C) and/or germanium (Ge) between the substrate and the lower interconnection. This second blocking layer may include at least one of the first conductivity-type impurities or the second conductivity-type impurities.

In still further embodiments, the semiconductor device may also include a data storage element on the switching device and an upper interconnection on the data storage element, where the data storage element comprises a phase-change pattern.

In some embodiments, the lower interconnection may be on an active region that protrudes from the substrate, and the lower interconnection may have a width that exceeds a width of the active region.

In some embodiments, a bottom portion of the lower interconnection may be within a recess in the substrate.

In accordance with another aspect of the inventive concept, a semiconductor device is provided that includes a substrate having first conductivity-type impurities, a lower interconnection on the substrate and having second conductivity-type impurities, a switching device on the lower interconnection, and a blocking layer between the substrate and the lower interconnection. The blocking layer includes carbon, germanium, or a combination thereof.

In some embodiments, the blocking layer may have the same horizontal width as the lower interconnection.

In other embodiments, a trench defining an active region may be formed in the substrate. The blocking layer and the lower interconnection may be self-aligned on the active region.

In still other embodiments, the blocking layer may include a lower blocking layer in contact with the active region and having the first conductivity-type impurities, and an upper blocking layer in contact with the lower interconnection and having the second conductivity-type impurities.

In still other embodiments, a bottom of the blocking layer may be formed at a lower level than an upper surface of the substrate.

In still other embodiments, the second blocking layer may comprise a lower second blocking layer in contact with the active region and having the first conductivity-type impurities and an upper second blocking layer in contact with the lower interconnection and having the second conductivity-type impurities, and the first blocking layer may comprise a lower first blocking layer in contact with the lower interconnection and an upper first blocking layer in contact with the lower first blocking layer. A width of the lower first blocking layer may exceed a width of the upper first blocking layer.

In some embodiments, the blocking layer comprises a second blocking layer, and the semiconductor device further includes a first blocking layer that includes carbon (C) and/or germanium (Ge) between the lower interconnection and the switching device.

In some embodiments, a height of the lower interconnection may exceed a width of the lower interconnection.

In accordance with still another aspect of the inventive concept, a semiconductor device includes an active region confined to a substrate and having first conductivity-type impurities, a lower interconnection self-aligned on the active region, having a greater horizontal width than the active region, and having second conductivity-type impurities, a switching device on the lower interconnection, a data storage element disposed on the switching device, and an upper interconnection on the data storage element. The lower interconnection is a semiconductor layer formed using a selective epitaxial growth (SEG) process or a solid phase epitaxial growth process.

In some embodiments, a first blocking layer may be between the lower interconnection and the switching device. The first blocking layer may include carbon, germanium, or a combination thereof.

In other embodiments, the switching device may include a first semiconductor pattern in contact with the first blocking layer, and a second semiconductor pattern on the first semiconductor pattern. The concentration of the second conductivity-type impurities in the first semiconductor pattern may be lower than that in the lower interconnection.

In still other embodiments, the first blocking layer may include a lower blocking layer in contact with the lower interconnection and having the same horizontal width as the lower interconnection, and an upper blocking layer in contact with the first semiconductor pattern and having the same horizontal width as the first semiconductor pattern.

In still other embodiments, a second blocking layer may be provided between the active region and the lower interconnection. The second blocking layer may include carbon, germanium, or a combination thereof.

In accordance with still another aspect of the inventive concept, a method of forming a semiconductor device includes forming a lower interconnection having second conductivity-type impurities on a substrate having first conductivity-type impurities, forming a first blocking layer on the lower interconnection, and forming a switching device on the first blocking layer. The first blocking layer includes carbon, germanium, or a combination thereof.

In some embodiments, the lower interconnection and the first blocking layer may be formed using an in-situ process.

In accordance with still another aspect of the inventive concept, a method of forming a semiconductor device includes forming a silicon layer on a substrate via an epitaxial growth process, the silicon layer comprising at least part of a lower interconnection of the semiconductor device, and the silicon layer being doped during the epitaxial growth process with second conductivity-type impurities. A first silicon blocking layer is formed on the lower interconnection that includes at least one of carbon or germanium. A switching device is formed on the first silicon blocking layer so that the first silicon blocking layer is between the lower interconnection and the switching device.

In some embodiments, a second silicon blocking layer that includes at least one of carbon or germanium may be formed between the substrate and the lower interconnection.

In some embodiments, the second silicon blocking layer may be formed via an epitaxial growth process.

In still further embodiments, the substrate may be doped with first conductivity type impurities, and the second silicon blocking layer may be doped with at least one of the first conductivity-type impurities or the second conductivity-type impurities.

In some embodiments, the lower interconnection may be partly formed in a recess in the substrate.

In other embodiments, the lower interconnection may comprise a word line, and the semiconductor device may comprise a phase change memory device.

In still further embodiments, a height of the lower interconnection may exceed a width of the lower interconnection.

In some embodiments, the switching device may be formed by forming a first semiconductor pattern having second conductivity-type impurities that is in direct contact with the first silicon blocking layer and forming a second semiconductor pattern on the first semiconductor pattern, where a first concentration of the second conductivity-type impurities in the first semiconductor pattern is lower than a second concentration of the second conductivity-type impurities in the silicon layer of the lower interconnection.

In other embodiments, the first silicon blocking layer may be formed to be self-aligned with the lower interconnection and may have the same horizontal width as the lower interconnection.

In some embodiments, the first second silicon blocking layer may have the same horizontal width as the lower interconnection.

In still further embodiments, a bottom of the second silicon blocking layer may be formed at a lower level than an upper surface of the substrate.

In some embodiments, the second silicon blocking layer may be formed on a top surface and side surfaces of an active region in the substrate.

In some embodiments, a third silicon blocking layer may be formed in an upper portion of the active region by ion implantation of carbon and/or germanium ions prior to forming the second silicon blocking layer.

Details of other embodiments are included in the detailed description and drawings.

BRIEF DESCRIPTION OF THE DRAWINGS

The foregoing and other features and advantages of the inventive concepts will be apparent from the following more detailed description of example embodiments of the inventive concepts, which are illustrated in the accompanying drawings. In these drawings, like reference characters refer to the same elements. The drawings are not necessarily to scale, emphasis instead being placed upon illustrating the principles of the inventive concepts. In the drawings.

DETAILED DESCRIPTION OF THE EMBODIMENTS

Figure 1:
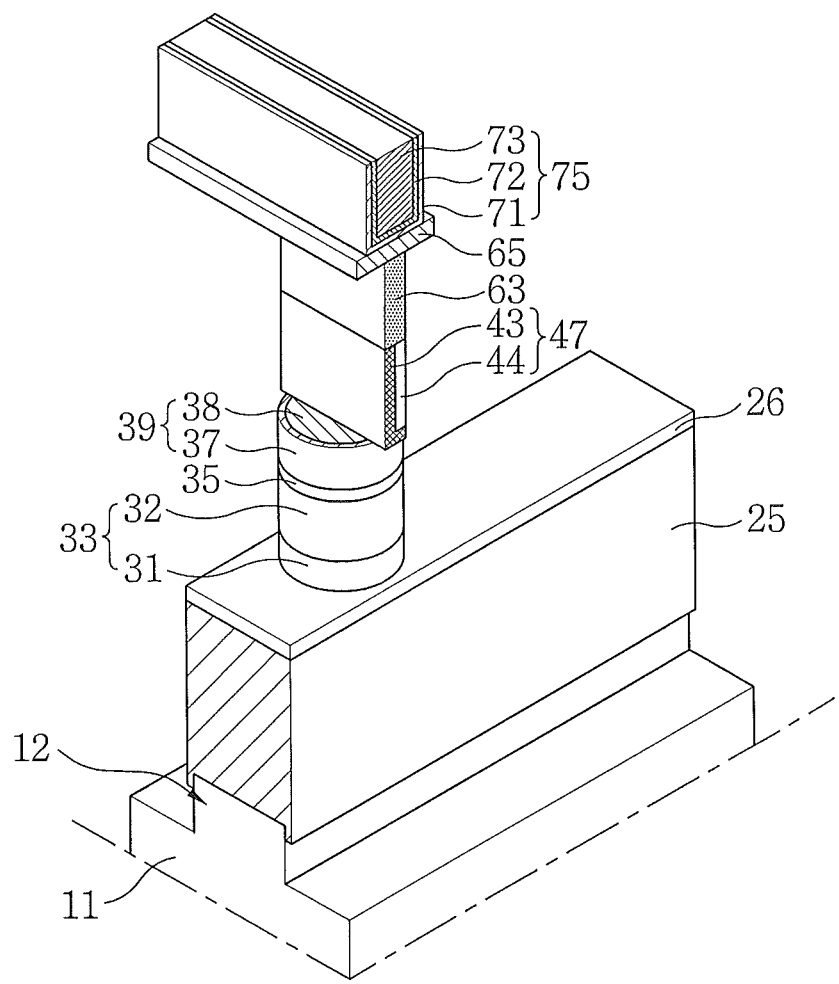
FIG. 1 is a perspective view illustrating a semiconductor device in accordance with embodiments of the inventive concept.

Various embodiments will now be described more fully with reference to the accompanying drawings in which some embodiments are shown. These embodiments are provided so that this disclosure is thorough and complete and fully conveys the inventive concept to those skilled in the art. It will be appreciated, however, that the inventive concepts may be embodied in many different forms and should not be construed as limited to the embodiments set forth herein. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, etc. may be used herein in reference to elements of various embodiments, these elements should not be construed as limited by these terms. For example, a first element could be termed a second element, and a second element could be termed a first element, without departing from the scope of the present invention. Herein, the term "and/or" includes any and all combinations of one or more referenced elements.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the invention is not intended to limit the scope of the invention. For example, the articles "a," "an," and "the" are singular, but should not be interpreted as limiting the disclosed embodiments to only having a single one of the referenced element, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional diagrams that are schematic illustrations of idealized embodiments (and intermediate structures). As such, variations from the shapes depicted in the drawings as a result, for example, of manufacturing techniques and/or tolerances, are to be expected. Thus, embodiments should not be construed as limited to the particular shapes of regions illustrated herein but are to include deviations in shapes that result, for example, from manufacturing.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Figure 2:
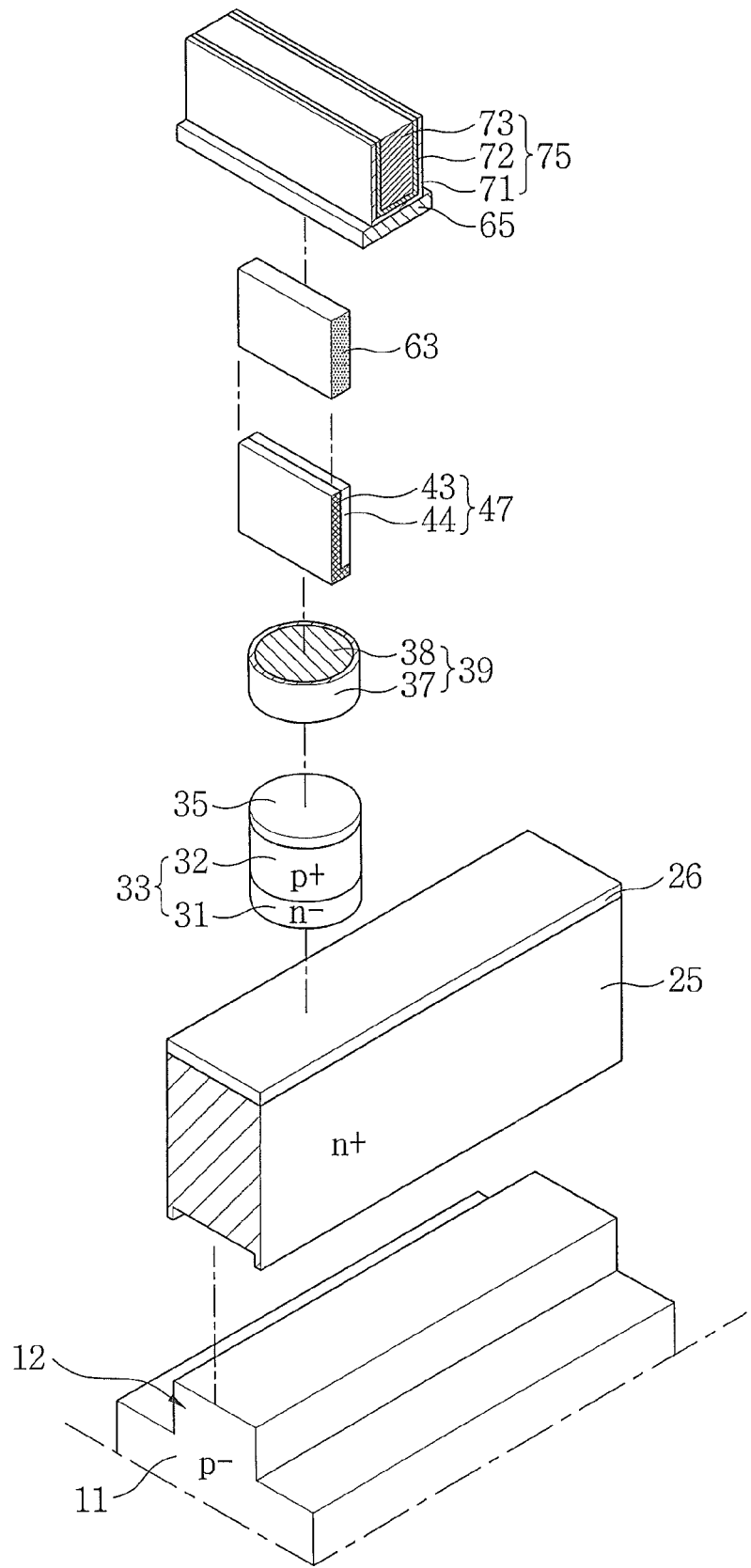
FIG. 2 is an exploded perspective view of the semiconductor device of FIG. 1.

FIG. 1 is a perspective view of a semiconductor device in accordance with embodiments of the inventive concept. FIG. 2 is an exploded perspective view the semiconductor device of FIG. 1. FIGS. 3 through 8 are perspective views illustrating portions of modified versions of the semiconductor device of FIG. 1 in accordance with further embodiments of the inventive concept. The non-volatile memory devices in accordance with the embodiments of the inventive concept that are depicted in FIGS. 1-8 may be phase-change memory devices.

Referring to FIGS. 1 and 2, an active region 12 may be defined on a semiconductor substrate 11. A word line 25 and a first blocking layer 26 may be sequentially formed on the active region 12. A switching device 33 may be formed on the first blocking layer 26. The switching device 33 may include a first semiconductor pattern 31 and a second semiconductor pattern 32 which are sequentially stacked. A metal silicide pattern 35 may be formed on the switching device 33. A lower pad 39 may be formed on the metal silicide pattern 35. The lower pad 39 may include a first barrier metal pattern 37 and a conductive pattern 38. Data storage elements 47 and 63 may be formed on the lower pad 39. The data storage elements 47 and 63 may include an electrode structure 47 and a phase-change pattern 63 disposed on the electrode structure 47. The electrode structure 47 may include a lower electrode 43 and a resistive pattern 44. An upper electrode 65 may be formed on the phase-change pattern 63. A bit line 75 may be formed on the upper electrode 65. The bit line 75 may include a second barrier metal pattern 71, a seed layer 72, and a bit line conductive layer 73.

The semiconductor substrate 11 may comprise any suitable semiconductor substrate such as, for example, a single crystalline silicon wafer, a silicon on insulator (SOI) wafer or a silicon epitaxial layer. It will also be appreciated that the semiconductor substrate 11 may be formed of semiconductor materials other than silicon. The semiconductor substrate 11 may include first conductivity-type impurities. The word line 25 may include second conductivity-type impurities. The first conductivity-type may be p-type or n-type. When the first conductivity-type is p-type, the second conductivity-type may be n-type. When the first conductivity-type is n-type, the second conductivity-type may be p-type. Hereinafter, the embodiments will be described assuming that the first conductivity-type is p-type, and the second conductivity-type is n-type, although it will be appreciated that in other embodiments the conductivity types may be reversed. For a silicon semiconductor substrate, the p-type impurities may include, for example, boron (B), and the n-type impurities may include, for example, phosphorous, Arsenic (As), or a combination thereof.

The active region 12 may be formed to have a bar-shape having a long axis (a longitudinal axis) and a short axis (a transverse axis) in the semiconductor substrate 11. The active region 12 may be interpreted as protruding vertically from the semiconductor substrate 11 along a vertical axis that is normal to both the longitudinal axis and the transverse axis. The active region 12 may include first conductivity-type impurities. For example, the active region 12 may be single crystalline silicon that includes p-type impurities.

The word line 25 may be in contact with the active region 12. The word line 25 may be formed along an upper surface of the active region 12. The word line 25 may be self-aligned on the active region 12. The horizontal width of the word line 25 (i.e., the width along a transverse axis of the word line 25) may be greater than the horizontal width of the active region 12. The word line 25 may cover the upper surface of the active region 12, and may also partially cover side surfaces of the active region 12. The height of the word line 25 (i.e., the distance that the word line extends along the vertical axis) may be greater than the horizontal width of the word line. The word line 25 may be a semiconductor layer that is formed using a selective epitaxial growth (SEG) process or a solid phase epitaxial growth process. For example, the word line 25 may be single crystalline silicon formed using an SEG process. The word line 25 may include n-type impurities. For example, the word line 25 may be single crystalline silicon including phosphorous.

The current driving capability of the word line 25 may increase as the concentration of the second conductivity-type impurities increases. For example, the current driving capability of the word line 25 may increase as the concentration of phosphorous included in the word line 25 increases. However, the second conductivity-type impurities included in the word line 25 may diffuse into the active region 12 and the semiconductor substrate 11. It has been discovered that the diffusion rate of second conductivity-type impurities that are included in a single crystalline silicon word line 25 that is formed using an SEG process or a solid phase epitaxial growth process into the active region 12 and the semiconductor substrate 11 is significantly lower than the diffusion rate of second conductivity-type impurities that are injected into an upper portion of the semiconductor substrate 11 (i.e., a portion of the semiconductor substrate 11 that is formed into a word line 25) into the active region 12 and the remainder of the semiconductor substrate 11.

For example, the diffusion rate of second conductivity-type impurities included in the word line 25 into the active region 12 and the semiconductor substrate 11 may be significantly lower than the diffusion rate of second conductivity-type impurities injected in the active region 12 using an ion implantation method into other portions of the active region 12 and the semiconductor substrate 11. When the second conductivity-type impurities diffuse into the active region 12 and the semiconductor substrate 11, leakage current may increase. According to the embodiments of the inventive concept, even when the concentration of the second conductivity-type impurities in the word line 25 is increased, diffusion of the second conductivity-type impurities into the active region 12 and the semiconductor substrate 11 may be reduced or minimized. Moreover, even when the horizontal width and the vertical height of the word line 25 are reduced, improved current driving capability may be secured, and even when the vertical height of the active region 12 is reduced, the configuration of the word line 25 and active region 12 may be very advantageous in high integration.

The first blocking layer 26 may be in contact with the word line 25. The first blocking layer 26 may be formed along an upper surface of the word line 25. The first blocking layer 26 may be self-aligned on the word line 25. The horizontal width of the first blocking layer 26 may be substantially the same as the horizontal width of the word line 25. The first blocking layer 26 may be a semiconductor layer including a different element from the word line 25. For example, the first blocking layer 26 may include carbon, germanium, or a combination thereof. In specific embodiments, the first blocking layer 26 may be single crystalline silicon layer containing 1E18 atoms/cm$^3$ to 1E20 atoms/cm$^3$ of carbon or germanium. The first blocking layer 26 may be single crystalline silicon containing approximately 1E19 atoms/cm$^3$ of carbon. The first blocking layer 26 may be single crystalline silicon containing the second conductivity-type impurities and carbon.

The switching device 33 may be a PN diode. The first semiconductor pattern 31 may be in contact with an upper surface of the first blocking layer 26. The first semiconductor pattern 31 and the second semiconductor pattern 32 may be semiconductor layers formed using an SEG process or a solid phase epitaxial growth process. The first semiconductor pattern 31 may include the second conductivity-type impurities, and the second semiconductor pattern 32 may include the first conductivity-type impurities. For example, the first semiconductor pattern 31 may include single crystalline silicon containing n-type impurities. The second semiconductor pattern 32 may include single crystalline silicon containing p-type impurities. The concentration of the second conductivity-type impurities in the first semiconductor pattern 31 may be lower than the concentration of the second conductivity-type impurities in the word line 25. For example, the first semiconductor pattern 31 may be single crystalline silicon containing a lower concentration of n-type impurities than the word line 25.

The first blocking layer 26 may function to reduce or prevent the second conductivity-type impurities included in the word line 25 from diffusing into the first semiconductor pattern 31. Due to the configuration of the first blocking layer 26, off-current $I_{off}$ of the switching device 33 may be significantly decreased compared to that in the related art. Electrical characteristics of the switching device 33 may be significantly improved as compared to those in the related art even when the vertical height of the first semiconductor pattern 31 is reduced. The configuration of the first blocking layer 26 and first semiconductor pattern 31 may be very advantageous to achieving high integration.

In the embodiment to which the inventive concept is applied, the word line 25 may be referred to as a lower interconnection or a first conductive pattern, and the bit line 75 may be referred to as an upper interconnection or a second conductive pattern. In another embodiment, the word line 25 may be formed by implanting n-type impurities into the active region 12. In still another embodiment, the first semiconductor pattern 31 may be omitted. In still another embodiment, a part or all of the data storage elements 47 and 63 may be replaced by a magnetic tunnel junction (MTJ), a resistance memory cell, a polymer memory cell, a ferroelectric memory cell, or a combination thereof.

Figure 3:
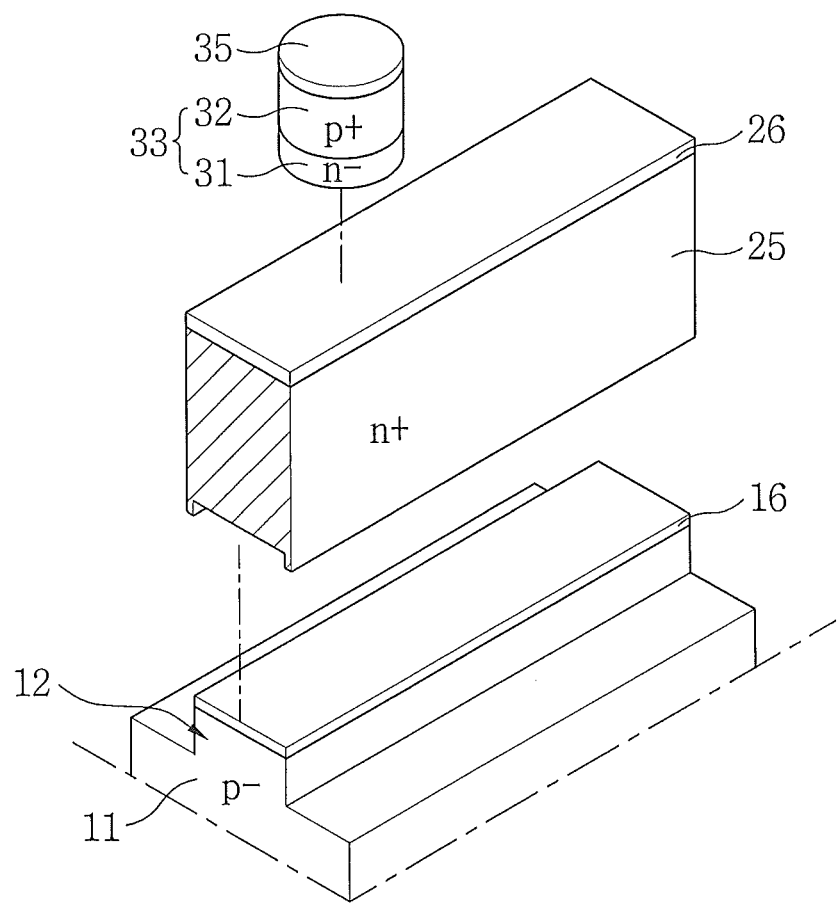
FIGS. 3 to 8 are perspective views illustrating respective portions of modified versions of the semiconductor device of FIG. 1 according to further embodiments of the inventive concept.

FIGS. 3-8 are perspective views illustrating the relevant portions of modified versions of the semiconductor device of FIG. 1 according to further embodiments of the present invention. As shown in FIG. 3, in one such alternative embodiment, a second blocking layer 16 may be formed on the active region 12. The word line 25 and the first blocking layer 26 may be sequentially formed on the second blocking layer 16. A first semiconductor pattern 31 and a second semiconductor pattern 32 may be formed on the first blocking layer 26. The second blocking layer 16 may function to reduce or prevent the second conductivity-type impurities included in the word line 25 from diffusing into the active region 12 and the semiconductor substrate 11. Even when the concentration of the second conductivity-type impurities in the word line 25 is increased, diffusion of the second conductivity-type impurities into the active region 12 and the semiconductor substrate 11 may be reduced or prevented. Even when the horizontal width and the vertical height of the word line 25 are reduced, excellent current driving capability may be provided. Further, even when the vertical height of the active region 12 is reduced, an increase in leakage current may be reduced or prevented.

The second blocking layer 16 may be formed along the upper surface of the active region 12. The second blocking layer 16 may include carbon, germanium, or a combination thereof. The second blocking layer 16 may be formed in an upper portion of the active region 12 using an ion-implantation process. For example, the second blocking layer 16 may be single crystalline silicon containing the first conductivity-type impurities and carbon. The active region 12 may be retained under the second blocking layer 16. The second blocking layer 16 may be self-aligned on the active region 12. The word line 25 may be in contact with the second blocking layer 16. The second blocking layer 16 may be interposed between the active region 12 and the word line 25. In other embodiments, the second blocking layer 16 may be single crystalline silicon containing second conductivity-type impurities and carbon.

Figure 4:
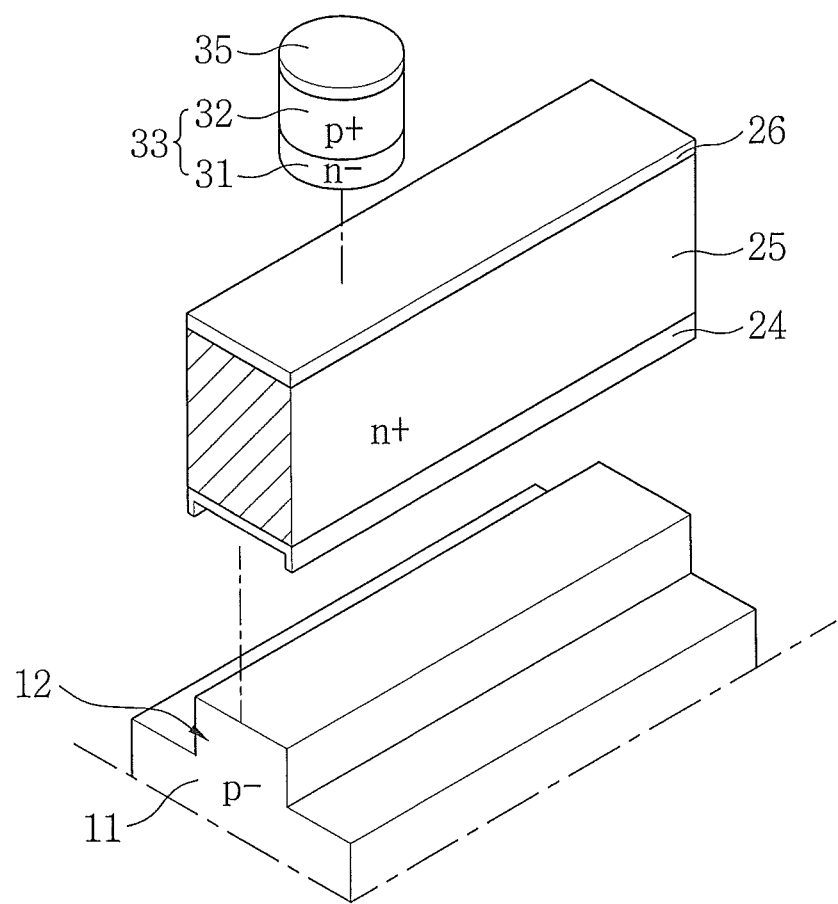

FIG. 4 depicts another alternative embodiment. As shown in FIG. 4, a third blocking layer 24 may be formed at the bottom of the word line 25. The third blocking layer 24 may include carbon, germanium, or a combination thereof. The third blocking layer 24 may be a semiconductor layer formed using an SEG process or a solid phase epitaxial growth process. For example, the third blocking layer 24 may be single crystalline silicon that is formed using an SEG process. The third blocking layer 24 may be single crystalline silicon containing carbon. The third blocking layer 24 may be single crystalline silicon containing second conductivity-type impurities and carbon. The third blocking layer 24 may function to reduce or prevent the second conductivity-type impurities included in the word line 25 from diffusing into the active region 12 and the semiconductor substrate 11.

The third blocking layer 24 may be formed along the upper surface of the active region 12. The third blocking layer 24 may be self-aligned on the active region 12. The third blocking layer 24 may be in contact with the active region 12. The word line 25 and the first blocking layer 26 may be sequentially formed on the third blocking layer 24. The word line 25 may be in contact with the third blocking layer 24. The third blocking layer 24 may be interposed between the active region 12 and the word line 25.

Figure 5:
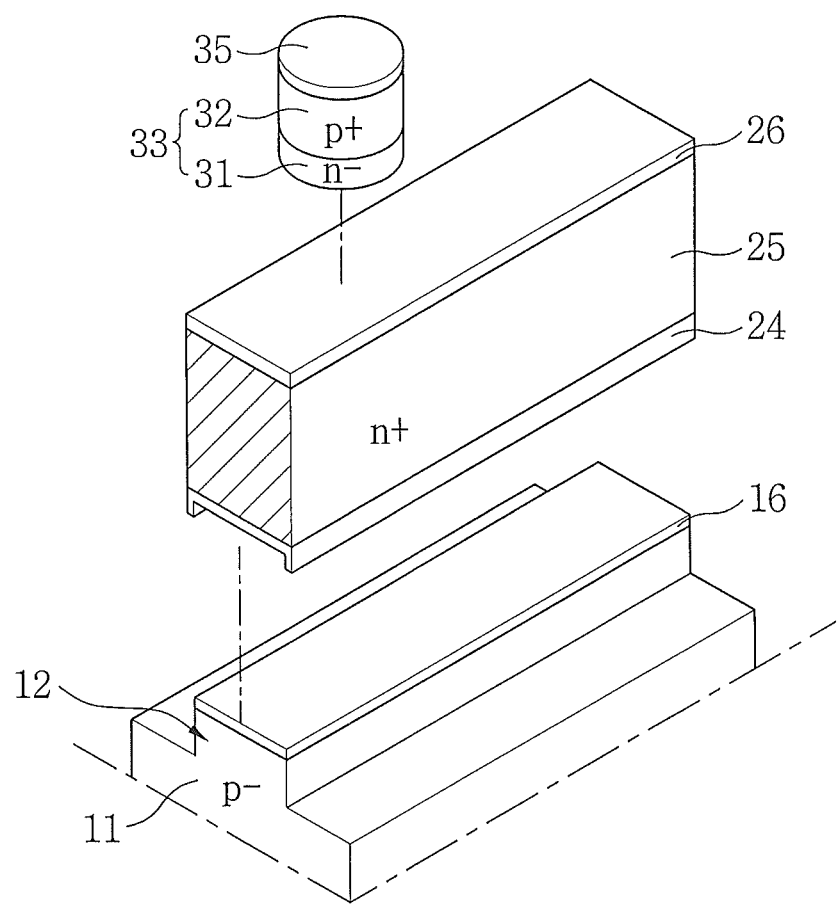

FIG. 5 depicts another alternative embodiment that combines aspects of the embodiments of FIGS. 1, 3 and 4. As shown in FIG. 5, in this embodiment a second blocking layer 16 may be formed on the active region 12, and a third blocking layer 24 may be formed at the bottom of the word line 25. The first blocking layer 26 may be formed on the word line 25. A first semiconductor pattern 31 and a second semiconductor pattern 32 may be formed on the first blocking layer 26. The second blocking layer 16 and the third blocking layer 24 may function to reduce or prevent the second conductivity-type impurities included in the word line 25 from diffusing into the active region 12 and the semiconductor substrate 11. The first blocking layer 26 may function to reduce or prevent the second conductivity-type impurities included in the word line 25 from diffusing into the first semiconductor pattern 31.

Figure 6:
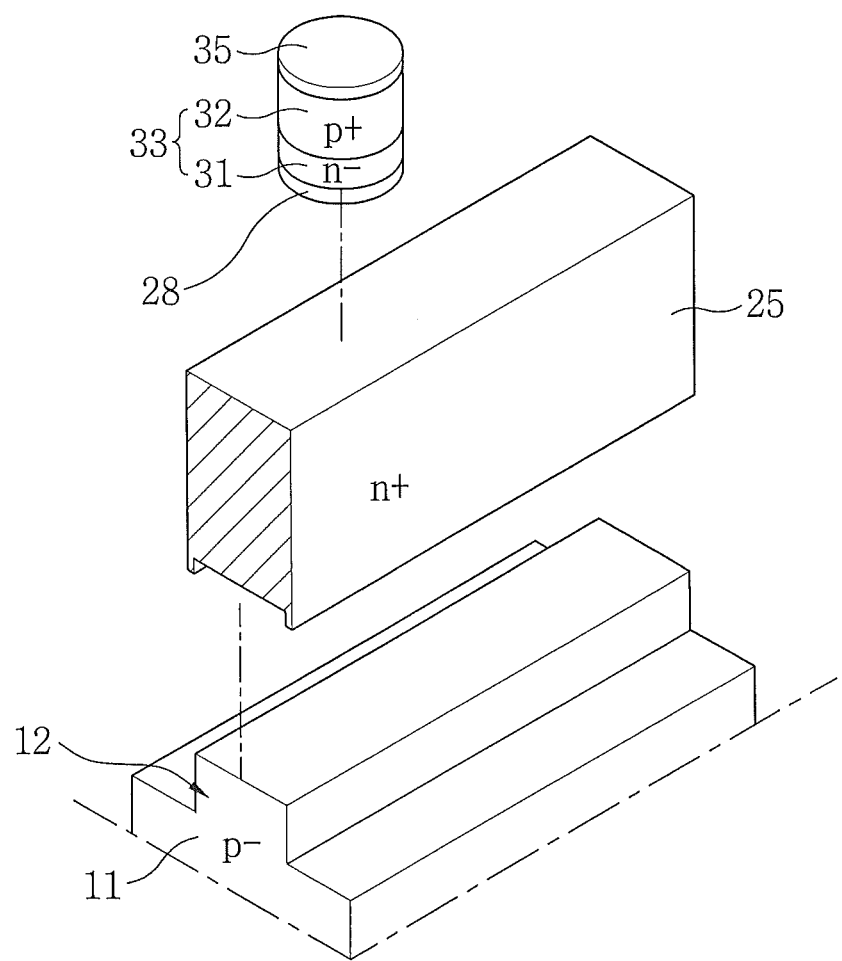

FIG. 6 depicts another alternative embodiment. As shown in FIG. 6, a fourth blocking layer 28 may be formed at the bottom of the first semiconductor pattern 31. The fourth blocking layer 28 may include carbon, germanium, or a combination thereof. The fourth blocking layer 28 may be a semiconductor layer formed using an SEG process or a solid phase epitaxial growth process. The fourth blocking layer 28 may be single crystalline silicon containing carbon. The fourth blocking layer 28 may be single crystalline silicon containing second conductivity-type impurities and carbon. The fourth blocking layer 28 may be interposed between the word line 25 and the first semiconductor pattern 31. The fourth blocking layer 28 may have the same horizontal width as the first semiconductor pattern 31. The fourth blocking layer 28 may have a smaller horizontal width than the word line 25. The fourth blocking layer 28 may function to reduce or prevent the second conductivity-type impurities included in the word line 25 from diffusing into the first semiconductor pattern 31.

Figure 7:
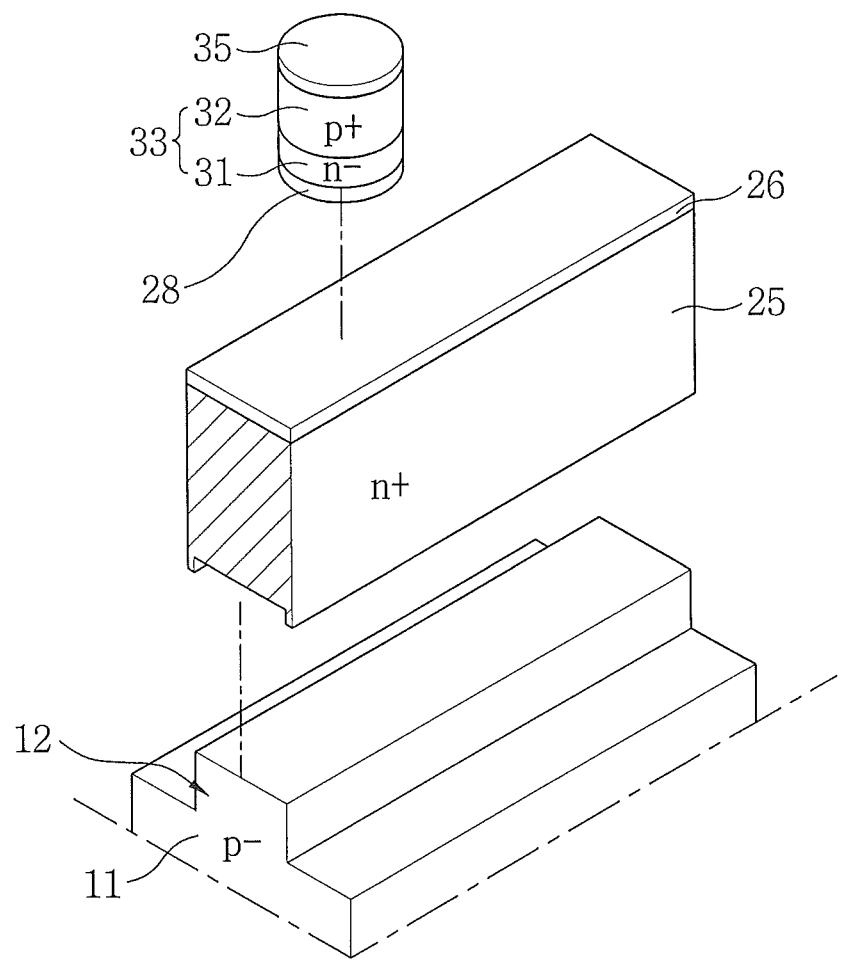

FIG. 7 depicts another alternative embodiment that combines aspects of the embodiments of FIGS. 1 and 6. As shown in FIG. 7, in this embodiment, a first blocking layer 26 may be formed on the word line 25, and a fourth blocking layer 28 may be formed at the bottom of the first semiconductor pattern 31. The first blocking layer 26 and the fourth blocking layer 28 may function to reduce or prevent the second conductivity-type impurities included in the word line 25 from diffusing into the first semiconductor pattern 31.

Figure 8:
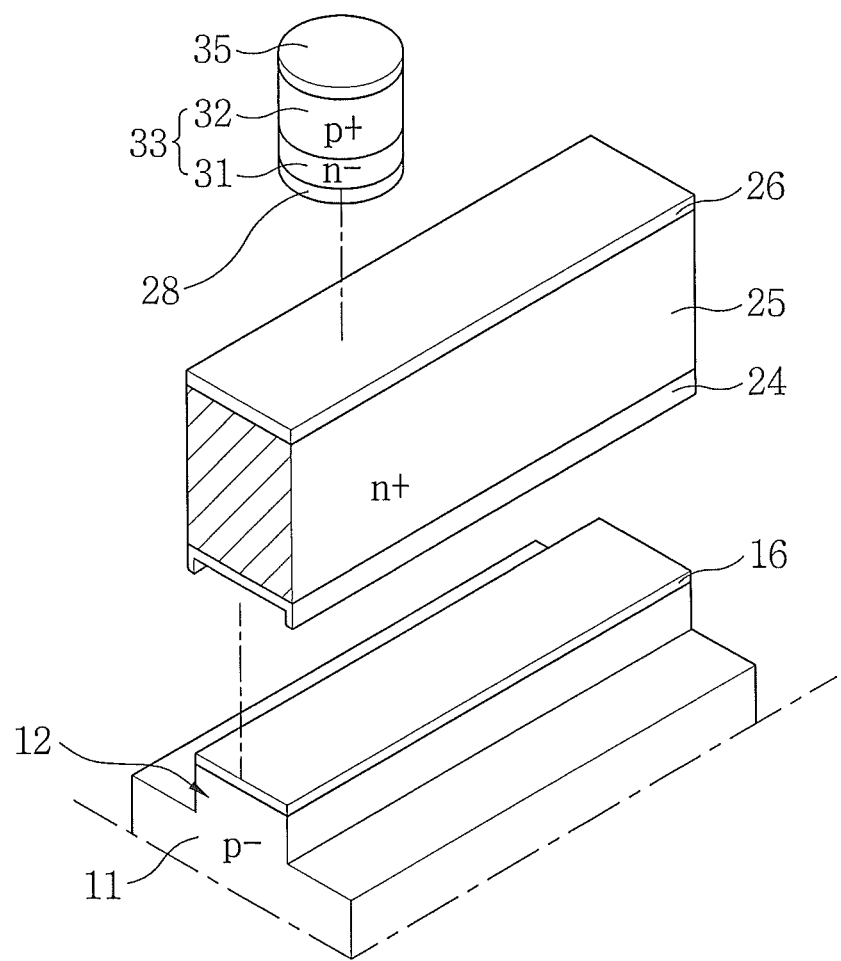

FIG. 8 depicts another alternative embodiment that combines aspects of the embodiments of FIGS. 1, 3, 4 and 6. As shown in FIG. 8, a second blocking layer 16 may be formed on the active region 12, a third blocking layer 24 may be formed at the bottom of the word line 25, a first blocking layer 26 may be formed on the word line 25, and a fourth blocking layer 28 may be formed at the bottom of the first semiconductor pattern 31. The first blocking layer 26 and the fourth blocking layer 28 may function to reduce or prevent the second conductivity-type impurities included in the word line 25 from diffusing into the first semiconductor pattern 31. The second blocking layer 16 and the third blocking layer 24 may function to reduce or prevent the second conductivity-type impurities included in the word line 25 from diffusing into the active region 12 and the semiconductor substrate 11.

Figure 9:
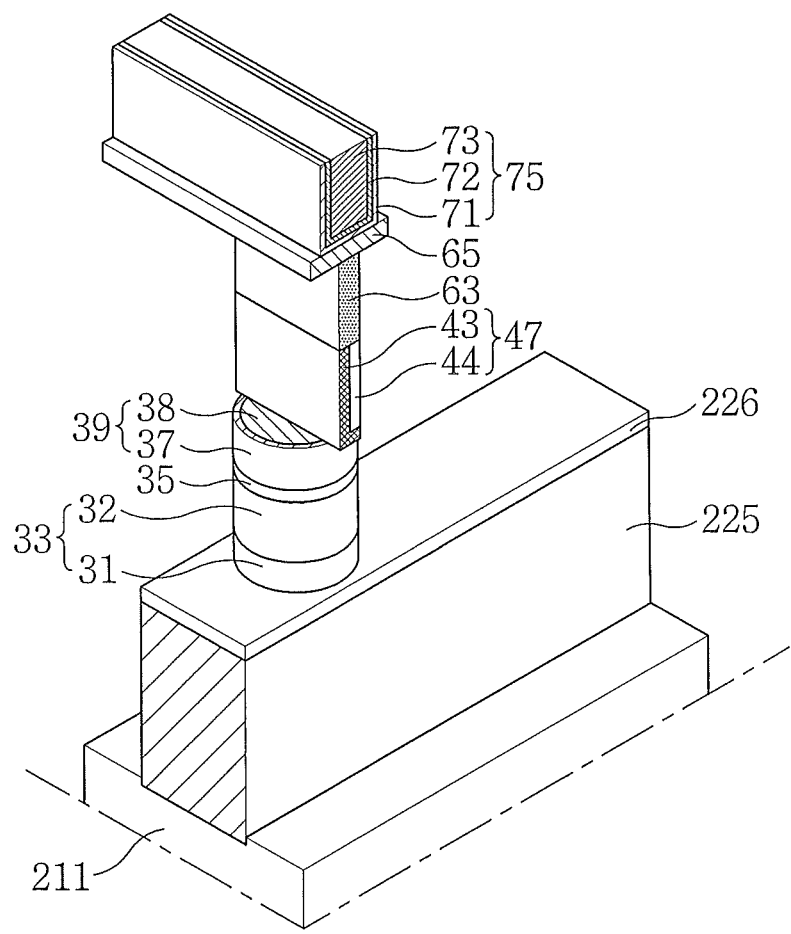
FIG. 9 is a perspective view illustrating a semiconductor device in accordance with further embodiments of the inventive concept.
Figure 10:
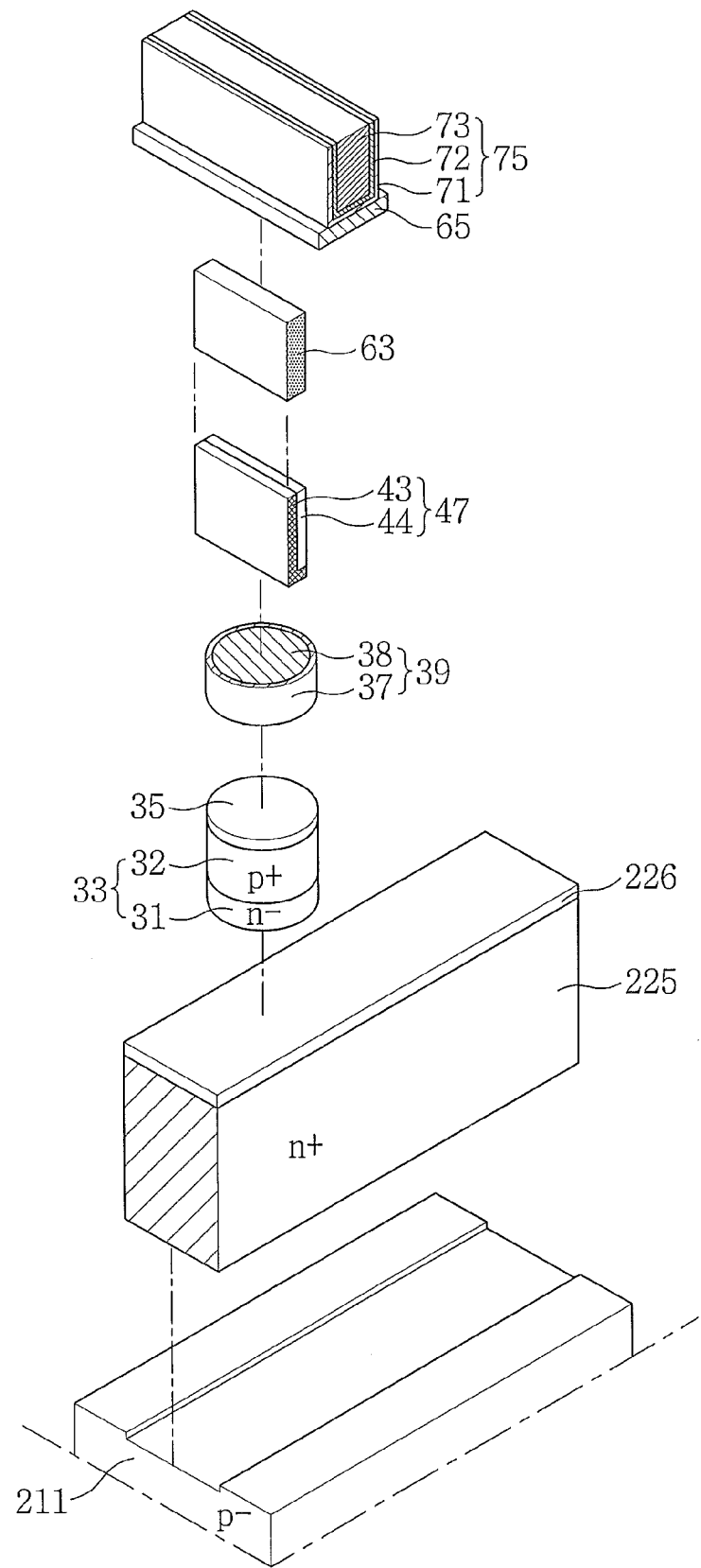
FIG. 10 is an exploded perspective view of the semiconductor device of FIG. 9.
Figure 11:
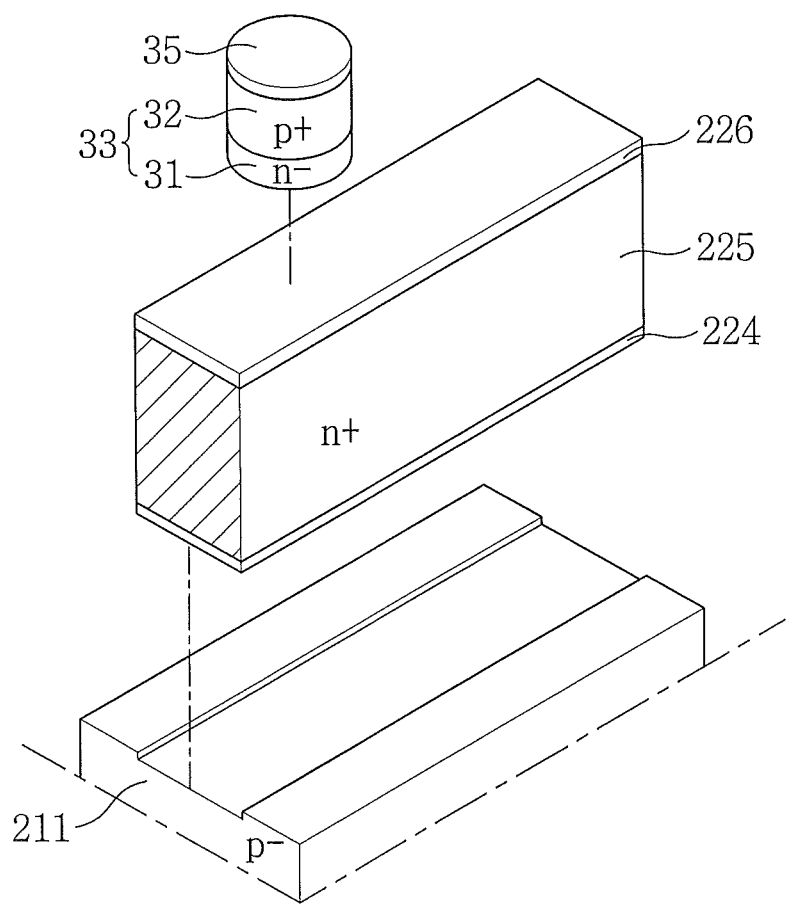
FIGS. 11 to 13 are perspective views illustrating respective portions of modified versions of the semiconductor device of FIG. 9 according to still further embodiments of the inventive concept.
Figure 12:
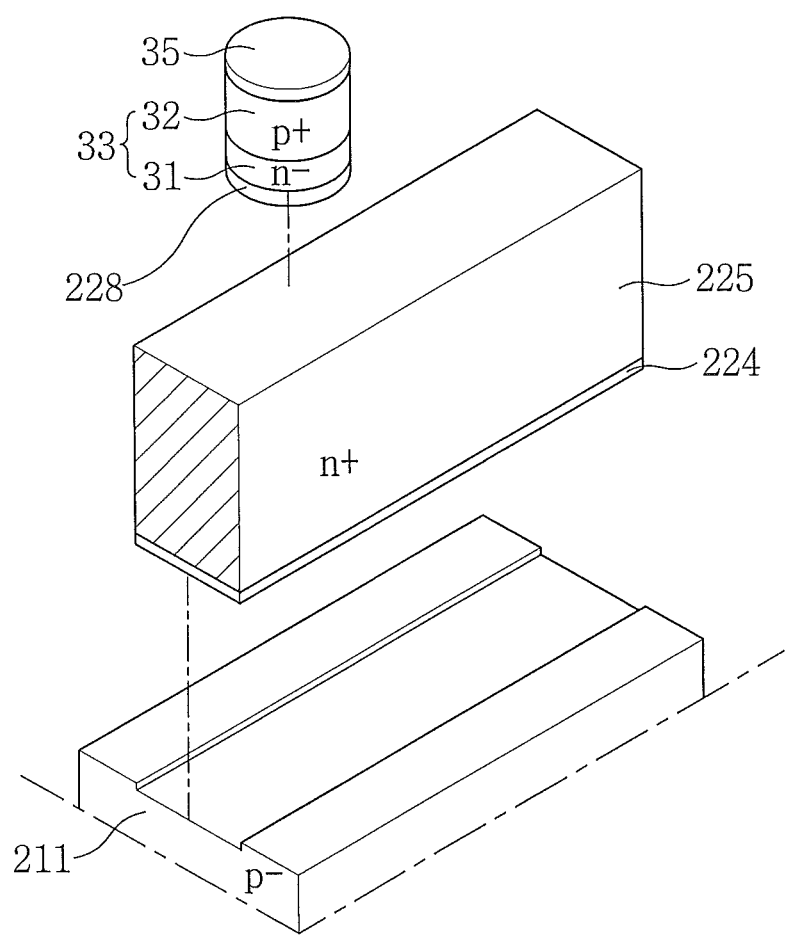
Figure 13:
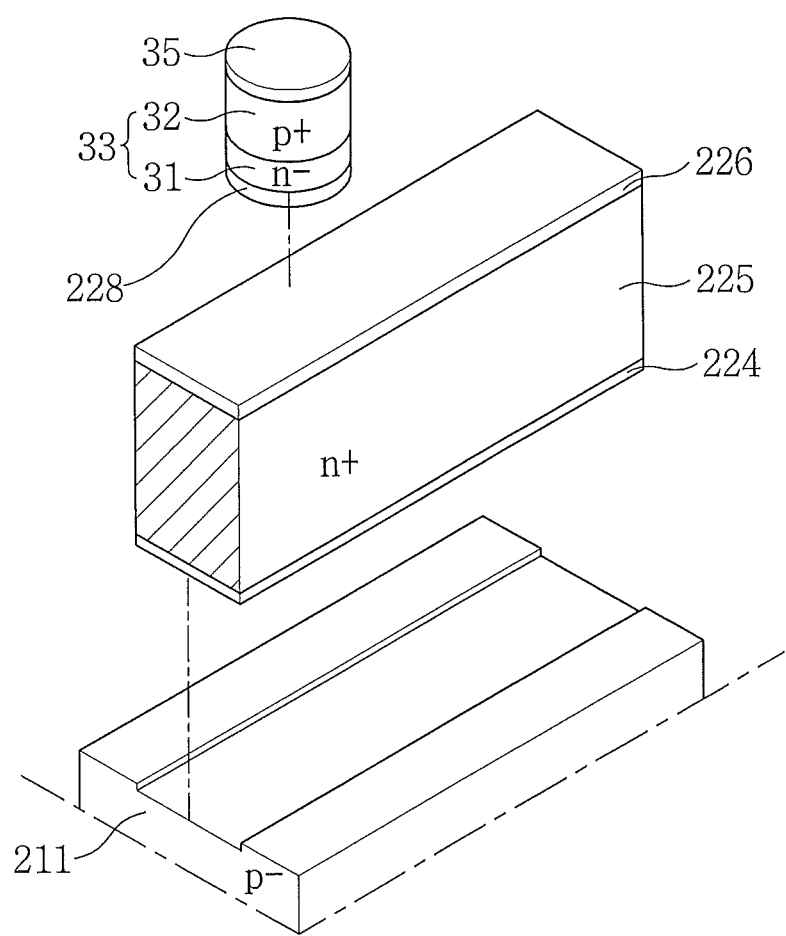

FIG. 9 is a perspective view illustrating a semiconductor device in accordance with further embodiments of the inventive concept, and FIG. 10 is an exploded perspective view of the semiconductor device of FIG. 9. FIGS. 11 to 13 are perspective views illustrating selected portions of modified versions of the semiconductor device of FIGS. 9-10 in accordance with still further embodiments of the inventive concept.

Referring to FIGS. 9 and 10, a word line 225 and a first blocking layer 226 may be sequentially formed on an active region 212 in a semiconductor substrate 211. The bottom of the word line 225 may be formed in a recessed region of the semiconductor substrate 211 that is lower than a top surface of the semiconductor substrate 211. A switching device 33 may be formed on the first blocking layer 226. The switching device 33 may include a first semiconductor pattern 31 and a second semiconductor pattern 32 which are sequentially stacked. A metal silicide pattern 35 may be formed on the switching device 33. A lower pad 39 may be formed on the metal silicide pattern 35. The lower pad 39 may include a first barrier metal pattern 37 and a conductive pattern 38. Data storage elements 47 and 63 may be formed on the lower pad 39. The data storage elements 47 and 63 may include an electrode structure 47 and a phase-change pattern 63 disposed on the electrode structure 47. The electrode structure 47 may include a lower electrode 43 and a resistive pattern 44. An upper electrode 65 may be formed on the phase-change pattern 63. A bit line 75 may be formed on the upper electrode 65.

The bit line 75 may include a second barrier metal pattern 71, a seed layer 72, and a bit line conductive layer 73.

The word line 225 may be formed to have a bar-shape that has a longitudinal axis, a transverse axis and a vertical axis that are normal to each other. The bottom surface of the word line 225 may be in contact with the semiconductor substrate 211. Sidewalls of the word line 225 may be partially in contact with the semiconductor substrate 211. The height of the word line 225 along the vertical axis may be greater than the horizontal width of the word line 225 along the transverse axis. The word line 225 may be a semiconductor layer formed using an SEG process or a solid phase epitaxial growth process. The word line 225 may include second conductivity-type impurities. For example, the word line 225 may be single crystalline silicon including phosphorous.

The first blocking layer 226 may be in contact with the word line 225. The first blocking layer 226 may be formed along an upper surface of the word line 225. The first blocking layer 226 may be a semiconductor layer that includes a different element from the word line 225. For example, the first blocking layer 226 may include carbon, germanium, or a combination thereof. For example, the first blocking layer 226 may be single crystalline silicon including carbon. The first blocking layer 226 may be single crystalline silicon containing second conductivity-type impurities and carbon. The first semiconductor pattern 31 may be in contact with an upper surface of the first blocking layer 226. The first blocking layer 226 may function to reduce or prevent the second conductivity-type impurities included in the word line 225 from diffusing into the first semiconductor pattern 31.

As shown in FIG. 11, in further embodiments, a third blocking layer 224 may be formed under the word line 225. The third blocking layer 224 may include carbon, germanium, or a combination thereof. The third blocking layer 224 may be a semiconductor layer formed using an SEG process or a solid phase epitaxial growth process. For example, the third blocking layer 224 may be single crystalline silicon formed using an SEG process. The third blocking layer 224 may be single crystalline silicon containing carbon. The third blocking layer 224 may be single crystalline silicon containing second conductivity-type impurities and carbon. The word line 225 and the first blocking layer 226 may be sequentially formed on the third blocking layer 224. The third blocking layer 224 may be interposed between the semiconductor substrate 211 and the word line 225. The third blocking layer 224 may function to reduce or prevent the second conductivity-type impurities included in the word line 225 from diffusing into the semiconductor substrate 211.

FIG. 12 depicts another alternative embodiment that combines aspects of the embodiments of FIGS. 9 and 11. As shown in FIG. 12, in this embodiment, the third blocking layer 224 may be formed at the bottom of the word line 225 and a fourth blocking layer 228 may be formed at the bottom of the first semiconductor pattern 31. The fourth blocking layer 228 may include carbon, germanium, or a combination thereof. The first blocking layer (reference numeral 226 in FIG. 11) may be omitted in this embodiment. The third blocking layer 224 may function to reduce or prevent the second conductivity-type impurities included in the word line 225 from diffusing into the semiconductor substrate 211. The fourth blocking layer 228 may function to reduce or prevent the second conductivity-type impurities included in the word line 225 from diffusing into the first semiconductor pattern 31.

As shown in FIG. 13, in still other embodiments, the third blocking layer 224 may be formed at the bottom of the word line 225, the first blocking layer 226 may be formed on the word line 225 and the fourth blocking layer 228 may be formed at the bottom of the first semiconductor pattern 31.

Figure 14:
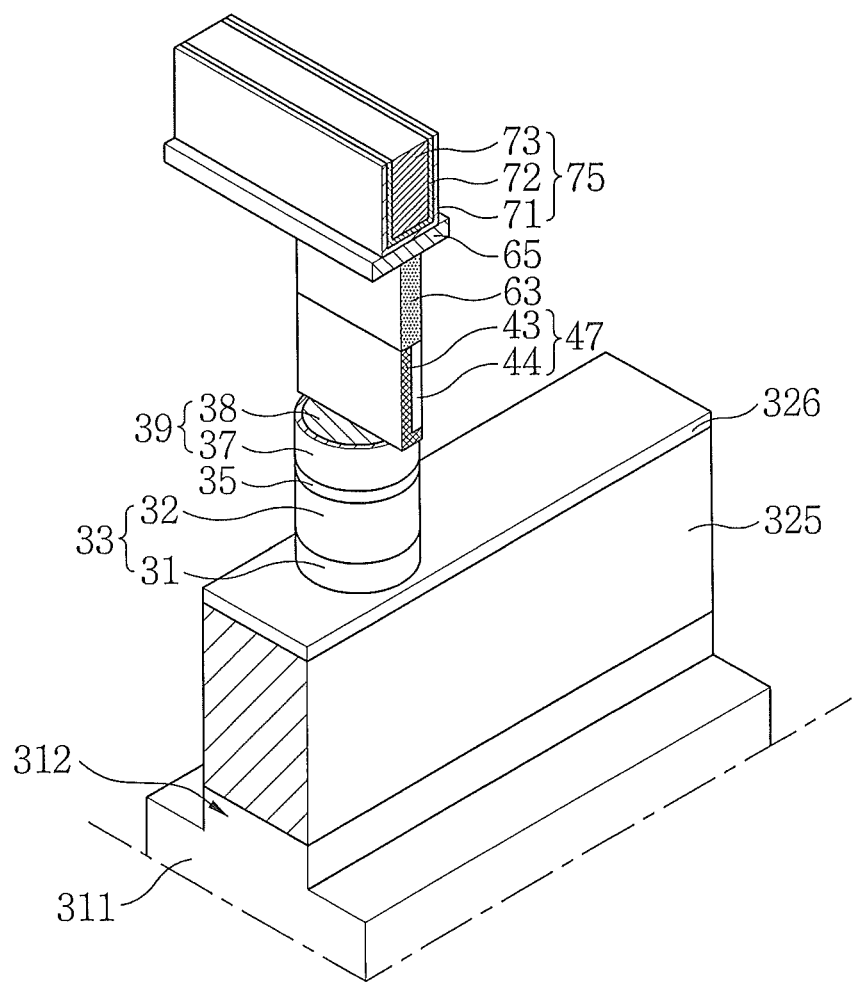
FIG. 14 is a perspective view illustrating a semiconductor device in accordance with additional embodiments of the inventive concept.
Figure 15:
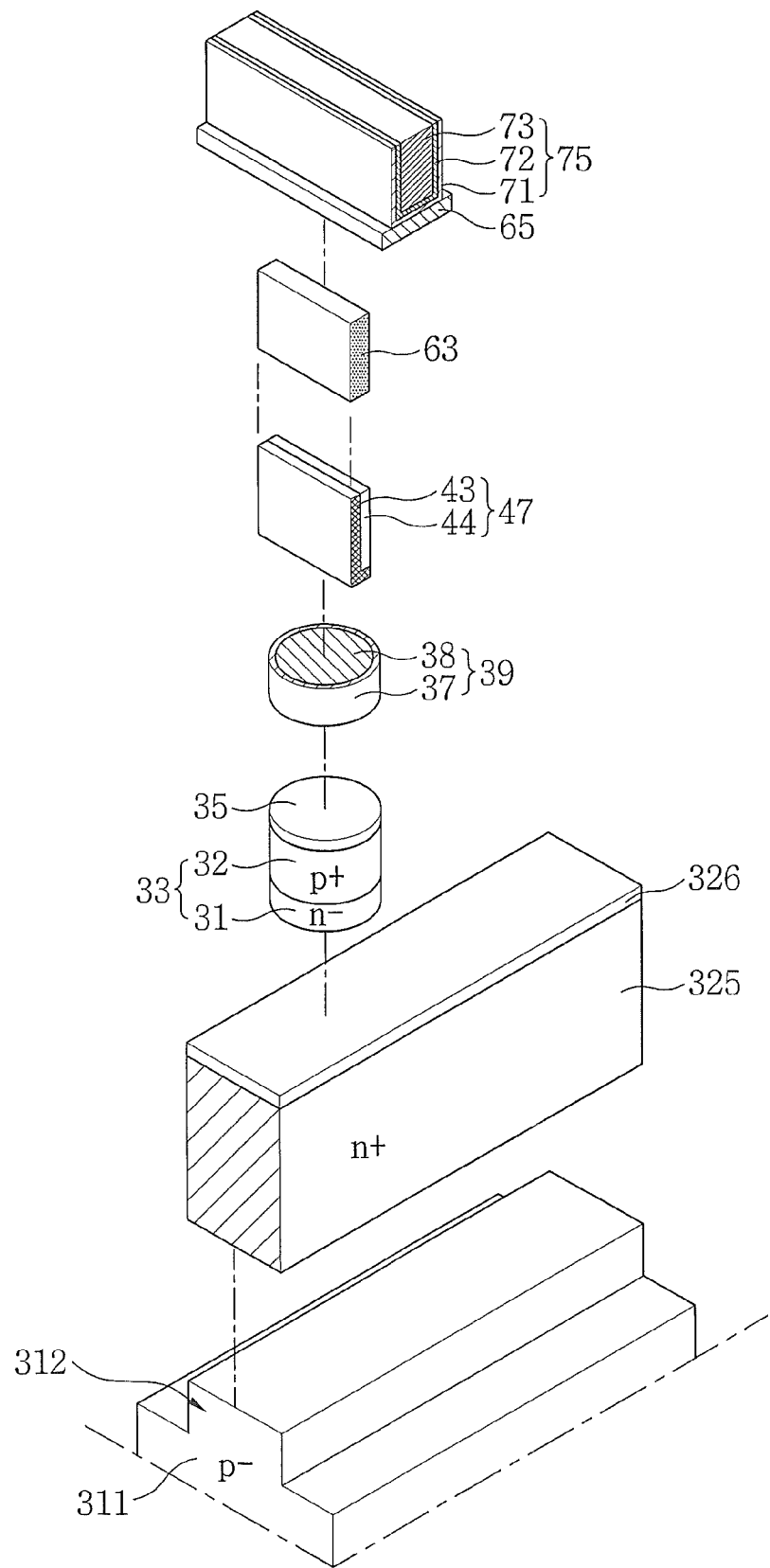
FIG. 15 is an exploded perspective view of the semiconductor device of FIG. 14.
Figure 16:
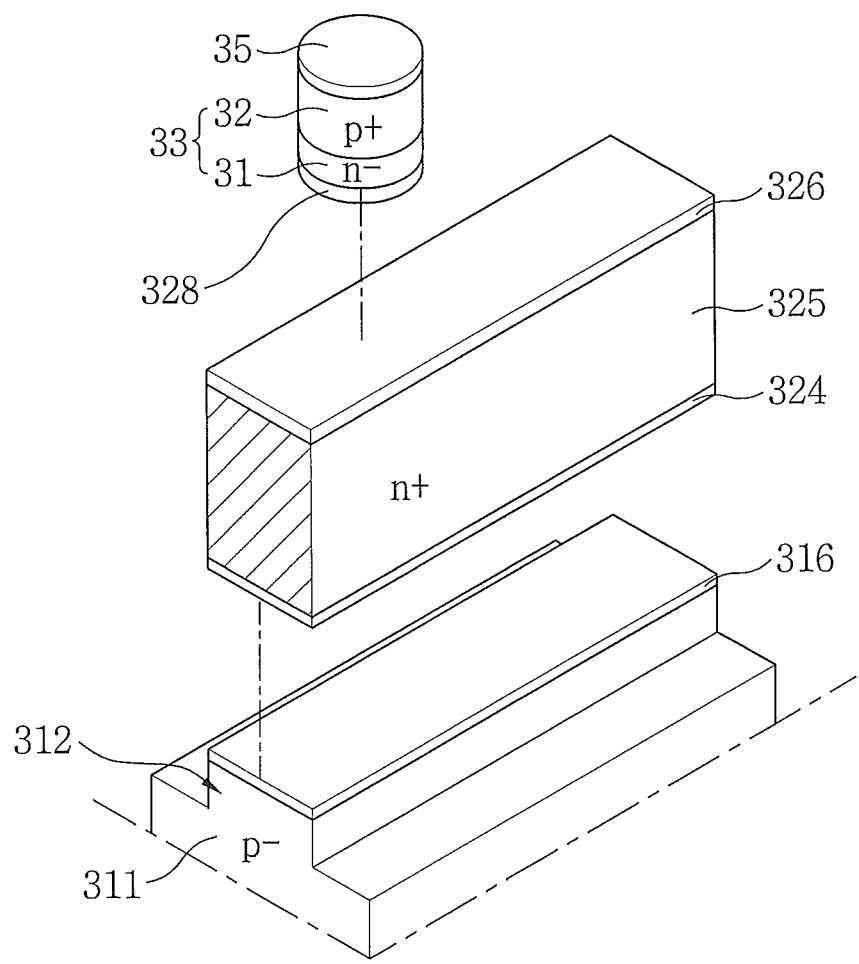
FIG. 16 is a perspective view illustrating a modified version of the semiconductor device of FIG. 14 according to still further embodiments of the inventive concept.

FIG. 14 is a perspective view illustrating a semiconductor device in accordance with further embodiments of the inventive concept, and FIG. 15 is an exploded perspective view of the semiconductor device of FIG. 14. FIG. 16 is a perspective view showing a portion of a semiconductor device in accordance with still further embodiments of the inventive concept.

Referring to FIGS. 14 and 15, an active region 312 may be defined on the semiconductor substrate 311. A word line 325 and a first blocking layer 326 may be sequentially formed on the active region 312. The word line 325 may have substantially the same horizontal width as the active region 312. A switching device 33 may be formed on the first blocking layer 326. The switching device 33 may include a first semiconductor pattern 31 and a second semiconductor pattern 32 which are sequentially stacked. A metal silicide pattern 35 may be formed on the switching device 33. A lower pad 39 may be formed on the metal silicide pattern 35. The lower pad 39 may include a first barrier metal pattern 37 and a conductive pattern 38. Data storage elements 47 and 63 may be formed on the lower pad 39. The data storage elements 47 and 63 may include an electrode structure 47 and a phase-change pattern 63 disposed on the electrode structure 47. The electrode structure 47 may include a lower electrode 43 and a resistive pattern 44. An upper electrode 65 may be formed on the phase-change pattern 63. A bit line 75 may be formed on the upper electrode 65. The bit line 75 may include a second barrier metal pattern 71, a seed layer 72, and a bit line conductive layer 73.

As shown in FIG. 16, in a modified embodiment, a second blocking layer 316 may be formed on the active region 312, a third blocking layer 324 may be formed at the bottom of the word line 325, the first blocking layer 326 may be formed on the bottom surface of the word line 325, and a fourth blocking layer 328 may be formed at the bottom of the first semiconductor pattern 31. The active region 312, the second blocking layer 316, the third blocking layer 324, the word line 325, and the first blocking layer 326 may have substantially the same horizontal width.

Figure 17:
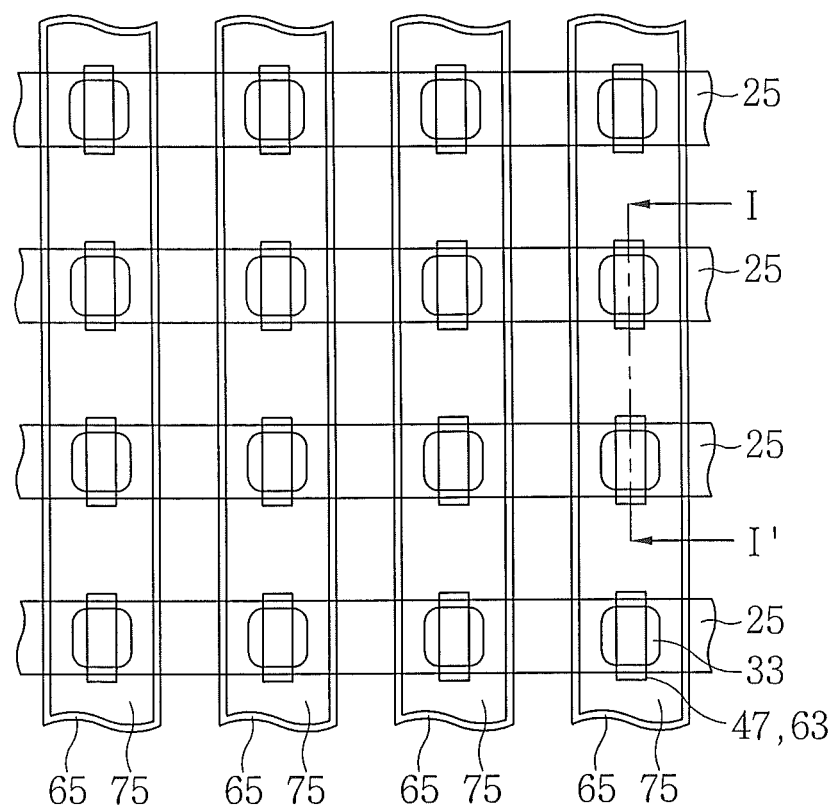
FIG. 17 is a plan view of a plurality of semiconductor devices in accordance with embodiments of the inventive concept.

FIG. 17 is a plan view of a plurality of semiconductor devices in accordance with embodiments of the inventive concept. FIGS. 18 to 23 are cross-sectional views taken along line I-I' of FIG. 17 for describing methods of fabricating semiconductor devices in accordance with embodiments of the inventive concept.

Referring to FIG. 17, word lines 25 that are aligned in parallel to each other may be formed in a cell array region of a semiconductor device. Bit lines 75 are formed that cross over the word lines 25. The bit lines 75 may extend at right angles to the word lines 25. Switching devices 33 and data storage elements 47 and 63 may be formed at crossing points of the word lines 25 and the bit lines 75. The data storage elements 47 and 63 may include electrode structures 47 and phase-change patterns 63. Upper electrodes 65 may be formed between the phase-change patterns 63 and the bit lines 75. The upper electrodes 65 may be omitted in some embodiments.

Figure 18:
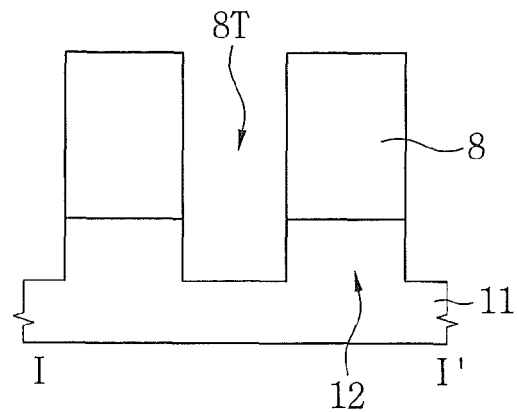
FIGS. 18 to 32 are cross-sectional views taken along line I-I' of FIG. 17 for describing methods of fabricating semiconductor devices in accordance with various embodiments of the inventive concept.

Referring to FIGS. 17 and 18, a mask pattern 8 may be formed on a semiconductor substrate 11. Trenches 8T defining active regions 12 may be formed in the semiconductor substrate 11 using the mask pattern 8 as an etch mask.

The semiconductor substrate 11 may be, for example, a single crystalline silicon wafer or a silicon on insulator (SOI) wafer. The semiconductor substrate 11 may include first conductivity-type impurities. For example, the semiconductor substrate 11 may be a single crystalline silicon wafer including p-type impurities. The mask pattern 8 may include a material having an etch selectivity with respect to the semiconductor substrate 11. The mask pattern 8 may include, for example, silicon oxide, silicon nitride, silicon oxynitride, polysilicon, a photoresist, or a combination thereof. The trenches 8T may be formed, for example, via a photolithography process or an anisotropic etching process. The active regions 12 may be disposed in parallel to each other. Each of the active regions 12 may have a bar-shape with a longituinal axis, a transverse axis and a vertical axis. The active regions 12 may include the first conductivity-type impurities. For example, the active regions 12 may be single crystalline silicon including p-type impurities.

Figure 19:
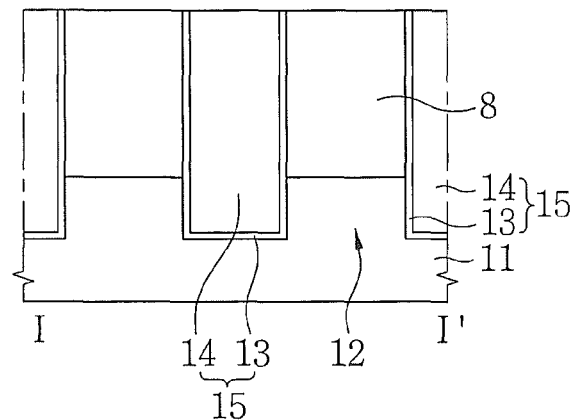

Referring to FIGS. 17 and 19, insulating patterns 15 may be formed that fill the trenches 8T. The insulating patterns 15 may include a first insulating layer 13 and a second insulating layer 14. The insulating patterns 15 may be formed by performing one or more thin-film formation processes followed by a planarization process. The planarization process may include a chemical mechanical polishing (CMP) process, an etch-back process, or a combination thereof.

Each of the first insulating layer 13 and the second insulating layer 14 may include silicon oxide, silicon nitride, silicon oxynitride, or a combination thereof. For example, the first insulating layer 13 may be silicon oxide, and the second insulating layer 14 may be silicon nitride. The first insulating layer 13 may be formed to cover sides and the bottom of the second insulating layer 14. The first insulating layer 13 may be interposed between the second insulating layer 14 and the active regions 12. Upper surfaces of the insulating patterns 15 may be formed at substantially the same level as an upper surface of the mask pattern 8. The upper surfaces ends of the insulating patterns 15 may be formed at a higher level than the active regions 12. Herein, references to a surface, layer or the like being "higher" than another surface, layer or the like are done so with reference to a height above a bottom surface of the semiconductor substrate.

Figure 20A:
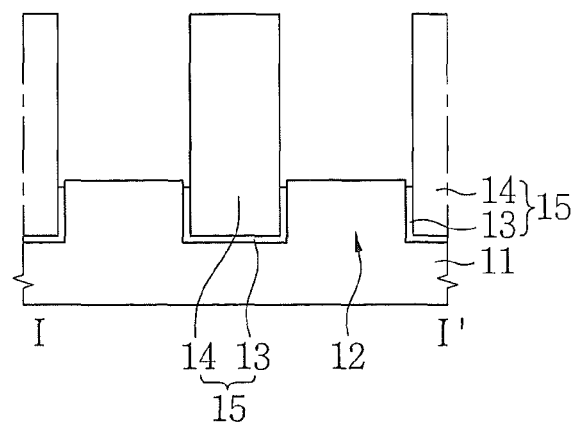
Figure 20B:
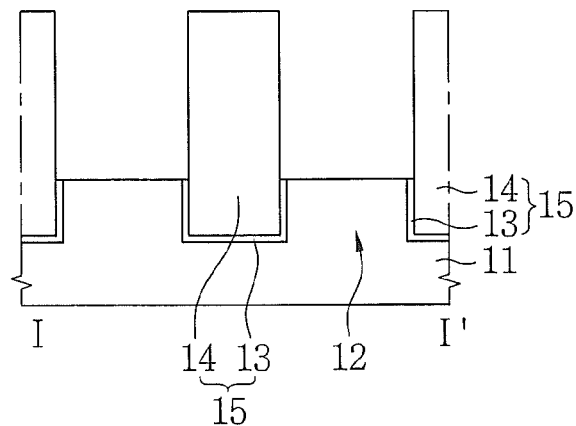
Figure 20C:
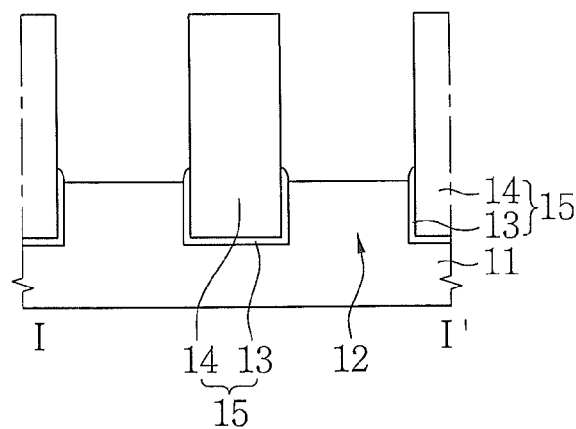

FIGS. 20A-20C illustrate methods of removing a portion of the first insulating layer 13 according to several different embodiments of the inventive concept. As shown in FIGS. 17 and 20A, according to a first of these methods, the mask pattern 8 may be removed to expose upper surfaces of the active regions 12. While the mask pattern 8 is removed, the first insulating layer 13 may also be partially removed. The first insulating layer 13 may be retained between the active regions 12 and the second insulating layer 14. The upper surface of the first insulating layer 13 may be at a lower level than the upper surfaces of the active regions 12. Side surfaces of the active regions 12 may be at least partially exposed, and upper surfaces of the active regions 12 may be exposed. The upper ends of the second insulating layer 14 may protrude at a higher level than the active regions 12.

As shown in FIG. 20B, in another embodiment, the upper ends of the first insulating layer 13 may be formed to have substantially the same level as the upper ends of the active regions 12. In this embodiment, the upper surfaces of the active regions 12 may be exposed, while the side surfaces of the active regions may not be exposed.

As shown in FIG. 20C, in yet another embodiment, the upper surface of the first insulating layer 13 may be formed at a higher level above the bottom surface of the semiconductor substrate 11 than is the upper surface of the active regions 12.

Figure 21A:
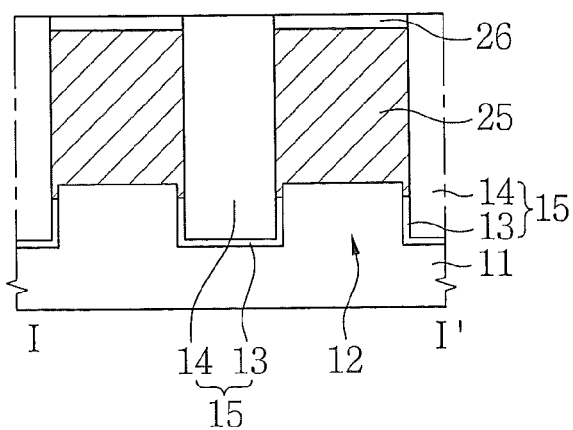

Referring to FIGS. 17 and 21A, word lines 25 and first blocking layers 26 may be sequentially formed on the active regions 12 of the embodiment of FIG. 20A. The word lines 25 may include second conductivity-type impurities. The first blocking layers 26 may be a semiconductor layer containing a different element from the word lines 25. The first blocking layers 26 may include carbon, germanium, or a combination thereof.

The word lines 25 may be a semiconductor layer formed using an SEG process or a solid phase epitaxial growth process. For example, the word lines 25 may be single crystalline silicon formed using an SEG process. The word lines 25 may include n-type impurities. For example, the word lines 25 may be single crystalline silicon including phosphorous. The word lines 25 may be in contact with the active regions 12. The word lines 25 may be formed along the upper surfaces of the active regions 12. The word lines 25 may be self-aligned on the active regions 12. The widths of the word lines 25 (i.e., the distance that the word lines 25 extend in the transverse direction) may be greater than the widths of the actives regions 12. The word lines 25 may cover the upper surfaces of the active regions 12, and may partially cover the side surfaces of the active regions 12. Each of the word lines 25 may be formed to have a vertical height that exceeds its horizontal width.

The first blocking layers 26 and the word lines 25 may be formed using an in-situ process. The first blocking layers 26 may be a semiconductor layer formed using an SEGn SEG process or a solid phase epitaxial growth process. For example, the first blocking layers 26 may be single crystalline silicon that is formed using an SEG process. The first blocking layers 26 may be single crystalline silicon containing carbon. The first blocking layers 26 may be single crystalline silicon containing second conductivity-type impurities and carbon. For example, the first blocking layers 26 may be single crystalline silicon containing phosphorous and carbon. The first blocking layers 26 may be formed along upper surfaces of the word lines 25. The first blocking layers 26 may be self-aligned on the word lines 25. The first blocking layers 26 may be formed to have substantially the same horizontal width as the word lines 25. The first blocking layers 26 may be in contact with the word lines 25.

Figure 21B:
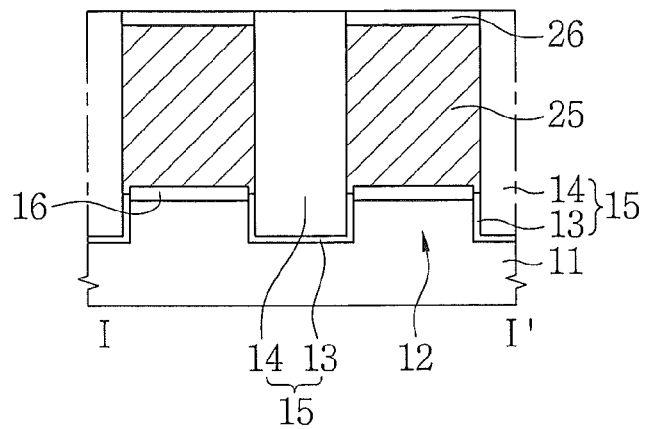

As shown in FIG. 21B, second blocking layers 16 may be formed on the upper surfaces of the active regions 12 of the embodiment of FIG. 20B before the word lines 25 are formed. The second blocking layers 16 may include carbon, germanium, or a combination thereof. The second blocking layers 16 may be formed in the active regions 12 using an ion-implantation process. For example, the second blocking layers 16 may be single crystalline silicon containing first conductivity-type impurities and carbon. The word lines 25 and the first blocking layers 26 may be sequentially formed on the second blocking layers 16. The word lines 25 may be in contact with the second blocking layers 16. The second blocking layers 16 may be interposed between the active regions 12 and the word lines 25. The second blocking layers 16 may be self-aligned on the active regions 12. The second blocking layers 16 may be in contact with the active regions 12. The second blocking layers 16 may have the same horizontal width as the active regions 12.

Figure 21C:
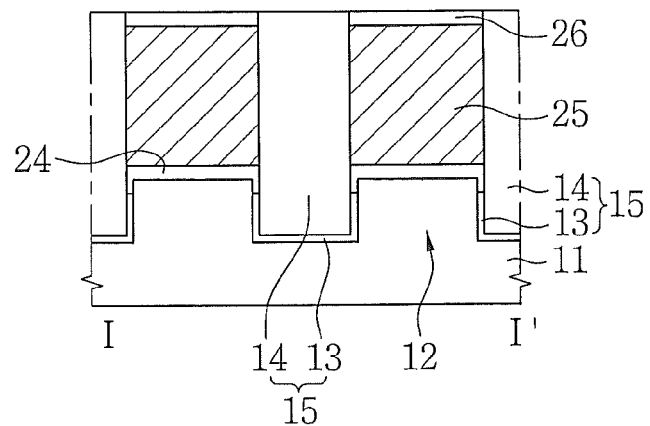

As shown in FIG. 21C, third blocking layers 24 may be formed on the active regions 12 of the embodiment of FIG. 20A before the word lines 25 are formed. The third blocking layers 24 may include carbon, germanium, or a combination thereof. The third blocking layers 24 may be a semiconductor layer formed using an SEG process or a solid phase epitaxial growth process. For example, the third blocking layers 24 may be single crystalline silicon formed using an SEG process. The third blocking layers 24 may be single crystalline silicon containing carbon. The third blocking layers 24 may be single crystalline silicon containing second conductivity-type impurities and carbon.

The third blocking layers 24 may be formed along the upper surfaces of the active regions 12. The third blocking layers 24 may be self-aligned on the active regions 12. The third blocking layers 24 may be in contact with the active regions 12. The word lines 25 and the first blocking layers 26 may be sequentially formed on the third blocking layers 24. The word lines 25 may be in contact with the third blocking layers 24. The third blocking layers 24 may be interposed between the active regions 12 and the word lines 25. The third blocking layers 24, the word lines 25, and the first blocking layers 26 may be formed using an in-situ process. The third blocking layers 24 may have the same horizontal width as the word lines 25. The third blocking layers 24 may have a greater horizontal width than the active regions 12. The third blocking layers 24 may partially cover the side surfaces of the active regions 12.

Figure 21D:
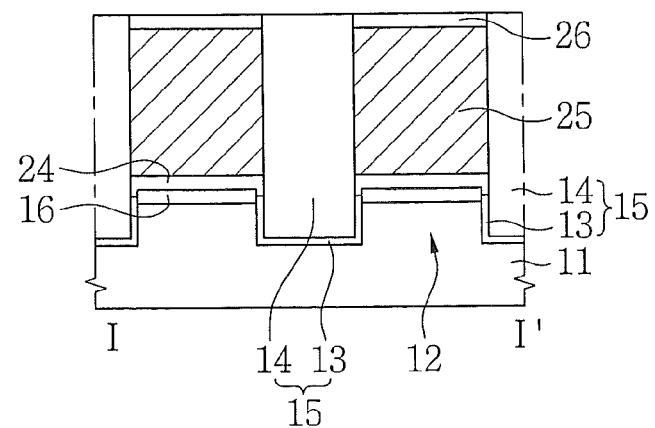

As shown in FIG. 21D, in still other embodiments, the second blocking layers 16, the third blocking layers 24, the word lines 25, and the first blocking layers 26 may be sequentially formed on the active regions 12. The third blocking layers 24 may be in contact with the second blocking layers 16.

Figure 22A:
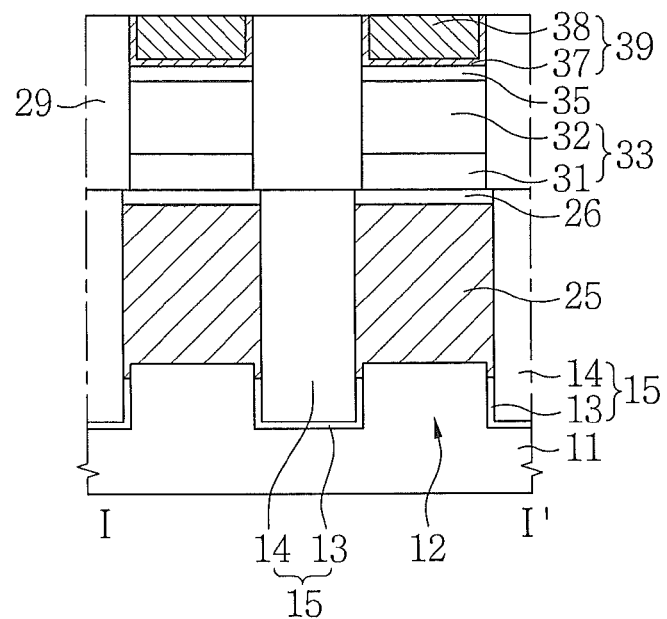

Referring to FIGS. 17 and 22A, an interlayer insulating layer 29 may be formed on the first blocking layers 26 and the insulating patterns 15 of the embodiment of FIG. 21A. Switching devices 33 may then be formed that extend through the interlayer insulating layer 29 to be in contact with the first blocking layers 26. Each of the switching devices 33 may include a first semiconductor pattern 31 and a second semiconductor pattern 32 which are sequentially stacked. Metal silicide patterns 35 may be formed on the switching devices 33. Lower pads 39 may be formed on the metal silicide patterns 35. Each of the lower pads 39 may include a first barrier metal pattern 37 and a conductive pattern 38 which is formed within a recess in the first barrier metal pattern.

The switching device 33 may be a PN diode. The first semiconductor pattern 31 may be in contact with an upper surface of the first blocking layer 26. The first semiconductor pattern 31 and the second semiconductor pattern 32 may be semiconductor layers formed using an SEG process or a solid phase epitaxial growth process. The first semiconductor pattern 31 may include the second conductivity-type impurities, and the second semiconductor pattern 32 may include the first conductivity-type impurities. For example, the first semiconductor pattern 31 may include single crystalline silicon containing n-type impurities. The second semiconductor pattern 32 may include single crystalline silicon containing p-type impurities. The concentration of the second conductivity-type impurities in the first semiconductor pattern 31 may be lower than the concentration of the second conductivity-type impurities in the word line 25. For example, the first semiconductor pattern 31 may be single crystalline silicon containing a lower concentration of n-type impurities than the word line 25. The first semiconductor pattern 31 may be single crystalline silicon containing a lower concentration of phosphorous than the word line 25.

The metal silicide patterns 35 may be in contact with the second semiconductor patterns 32. The first barrier metal pattern 37 and the conductive pattern 38 may be formed using thin-film formation processes and a planarization process. Upper surfaces of the lower pads 39 may be formed at the same level above the bottom surface of the semiconductor substrate as is an upper surface of the interlayer insulating layer 29. The first barrier metal pattern 37 may cover the sides and bottom of the conductive pattern 38. The first barrier metal pattern 37 may be in contact with the metal silicide pattern 35.

The metal silicide patterns 35 may include CoSi, NiSi, WSi, TiSi, or TaSi. For example, the metal silicide patterns 35 may be formed of a CoSi layer. The first barrier metal pattern 37 may include Ti, TiN, TiAlN, TiCN, TiSiN, TiON, Ta, TaN, TaAlN, TaCN, TaSiN, C, CN, CoSi, CoSiN, WN, WSi, WSiN, or a combination thereof. The conductive pattern 38 may include Ti, TiN, TiAlN, TiCN, TiSiN, TiON, Ta, TaN, TaAlN, TaCN, TaSiN, C, CN, CoSi, CoSiN, W, WN, WSi, WSiN, Ni, or a combination thereof. For example, the first barrier metal pattern 37 may be a Ti/TiN layer, and the conductive pattern 38 may be a W layer. The interlayer insulating layer 29 may include silicon oxide, silicon nitride, silicon oxynitride, or a combination thereof. Other appropriate materials may also or alternatively be used for the metal silicide patterns 35, the first barrier metal pattern 37, the conductive pattern 38 and/or the interlayer insulating layer 29.

The metal silicide patterns 35 and the lower pads 39 may be referred to as a diode electrode. The metal silicide patterns 35 and the lower pads 39 may be selectively omitted in some embodiments.

In other embodiments, the first semiconductor pattern 31 and the second semiconductor pattern 32 may be formed before the interlayer insulating layer 29. The first semiconductor pattern 31 and the second semiconductor pattern 32 may be formed using a thin-film formation process and a patterning process.

Figure 22B:
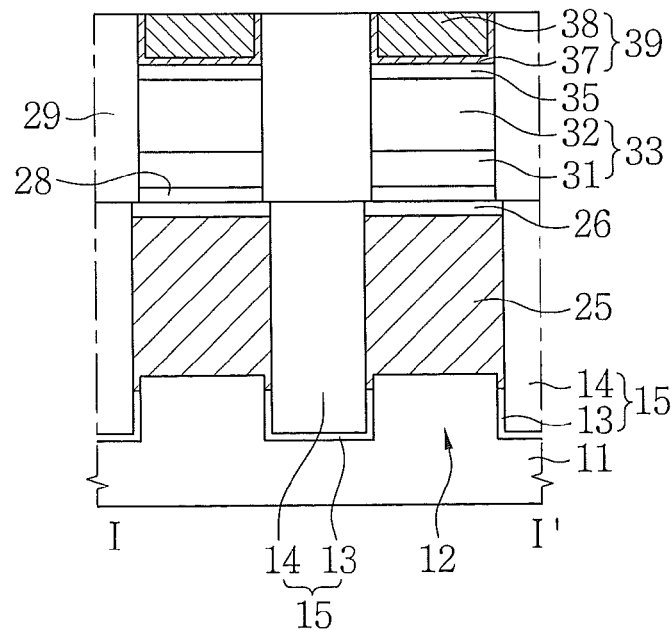

As shown in FIG. 22B, in other embodiments fourth blocking layers 28 may be formed on the first blocking layers 26 of the embodiment of FIG. 21A before the first semiconductor patterns 31 are formed. The fourth blocking layers 28 may include carbon, germanium, or a combination thereof. The fourth blocking layers 28 may be a semiconductor layer formed using a SEG process or a solid phase epitaxial growth process. The fourth blocking layers 28 may be single crystalline silicon containing carbon. The fourth blocking layers 28 may be single crystalline silicon containing second conductivity-type impurities and carbon.

The fourth blocking layers 28 may be in contact with the first blocking layers 26. The fourth blocking layers 28 may be interposed between the first blocking layers 26 and the first semiconductor patterns 31. The fourth blocking layers 28, the first semiconductor patterns 31, and the second semiconductor patterns 32 may be formed using an in-situ process. The fourth blocking layers 28 may have the same horizontal width as the first semiconductor patterns 31. The fourth blocking layers 28 may be in contact with the first semiconductor patterns 31. The fourth blocking layers 28 may have a smaller horizontal width than the word lines 25.

Figure 22C:
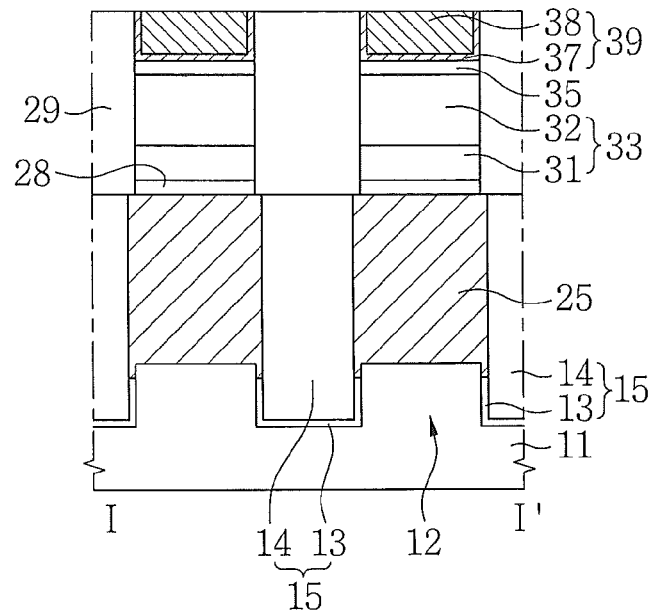

As shown in FIG. 22C, in still other embodiments, the first blocking layers 26 may be omitted and the fourth blocking layers 28 may be in contact with the word lines 25.

Figure 22D:
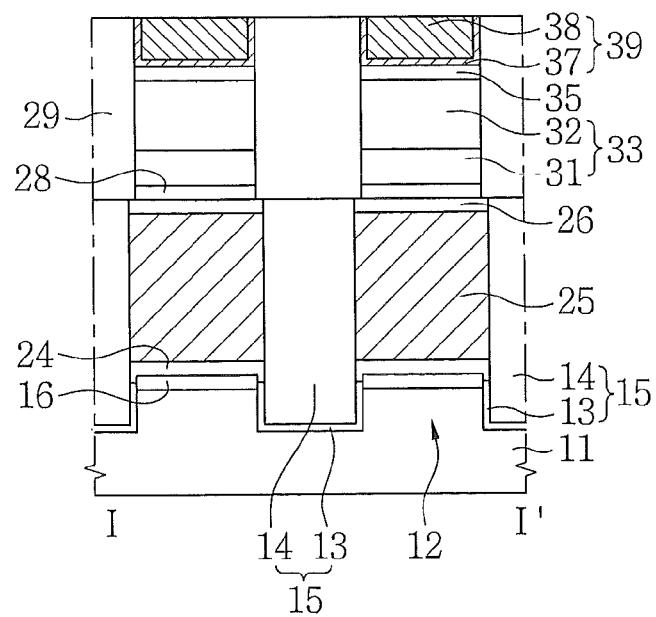

As shown in FIG. 22D, in still other embodiments the second blocking layers 16, the third blocking layers 24, the word lines 25, the first blocking layers 26, the fourth blocking layers 28, the first semiconductor patterns 31, the second semiconductor patterns 32, the metal silicide patterns 35, and the lower pads 39 may be formed on the active regions 12.

Figure 23:
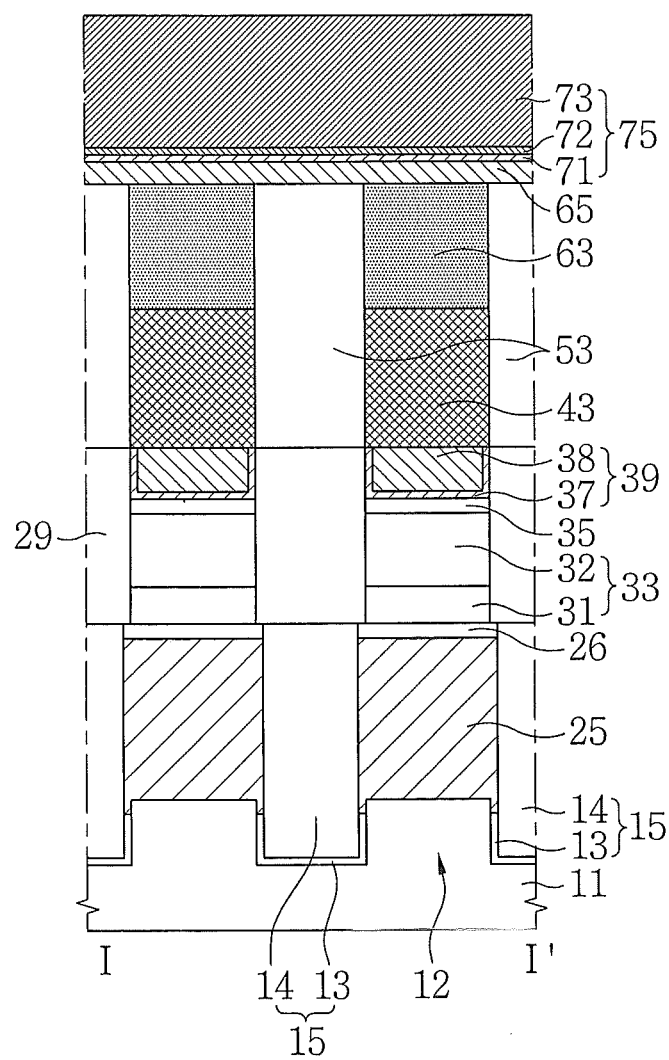

Referring to FIGS. 1, 17, and 23, an upper insulating layer 53 may be formed on the interlayer insulating layer 29 and the lower pads 39. Data storage elements may be formed that pass through the upper insulating layer 53 to be in contact with the lower pads 39. Each of the data storage elements may include an electrode structure 47 and a phase-change pattern 63 disposed on the electrode structure 47. The electrode structure 47 may include a lower electrode 43 and a resistive pattern 44. An upper electrode 65 that is in contact with the phase-change patterns 63 may be formed on the upper insulating layer 53. A bit line 75 may be formed on the upper electrode 65. The bit line 75 may include a second barrier metal pattern 71, a seed layer 72, and a bit line conductive layer 73.

The upper insulating layer 53 may include silicon oxide, silicon nitride, silicon oxynitride, or a combination thereof. The lower electrode 43 may include Ti, TiN, TiAlN, TiCN, TiSiN, TiON, Ta, TaN, TaAlN, TaCN, TaSiN, C, CN, CoSi, CoSiN, W, WN, WSi, WSiN, Ni, or a combination thereof. The resistive pattern 44 may include a different material from the lower electrode 43. The resistive pattern 44 may include a material having a higher resistivity than the lower electrode 43. The resistive pattern 44 may include an insulating material. The resistive pattern 44 may include polysilicon, silicon oxide, silicon nitride, silicon oxynitride, or a combination thereof.

Each of the phase-change patterns 63 may include GeSbTe, GeTeAs, SnTeSn, GeTe, SbTe, SeTeSn, GeTeSe, SbSeBi, GeBiTe, GeTeTi, InSe, GaTeSe, or InSbTe. Each of the phase-change patterns 63 may be a material layer including one selected from the group consisting of a GeSbTe layer, a GeTeAs layer, a SnTeSn layer, a GeTe layer, a SbTe layer, a SeTeSn layer, a GeTeSe layer, a SbSeBi layer, a GeBiTe layer, a GeTeTi layer, a InSe layer, a GaTeSe layer, and an InSbTe layer, and one selected from the group consisting of C, N, Si, and O. Each of the phase-change patterns 63 may be formed by stacking different materials. In other embodiments, each of the phase-change patterns 63 may be replaced by a polymer plug, a nanoparticle plug, or a variable resistance plug. For example, each of the phase-change patterns 63 may include a $SrTiO_3$ layer.

The upper electrodes 65 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, or a combination thereof. The second barrier metal pattern 71 may include Ti, TiN, or Ti/TiN. The seed layer 72 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, Al, Cu, or a combination thereof. The bit line conductive layer 73 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, Al, Cu, or a combination thereof. For example, the bit line conductive layer 73 may include a Cu layer formed by an electroplating method.

It will be appreciated that other materials may be used to form the various layers and elements described above in other embodiments.

FIGS. 24 to 27 are cross-sectional views taken along line I-I' of FIG. 17 that illustrate methods of fabricating semiconductor devices in accordance with further embodiments of the inventive concept.

Figure 24:
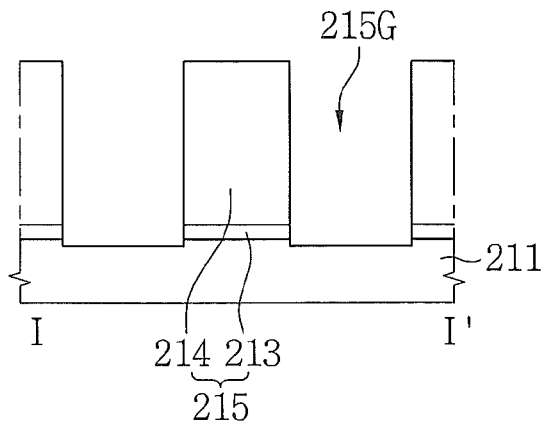

Referring to FIG. 24, insulating patterns 215 having grooves 215G may be formed on the semiconductor substrate 211. The semiconductor substrate 211 may be exposed through the bottoms of the grooves 215G. The bottoms of the grooves 215G may be formed at a lower level than an upper surface of the semiconductor substrate 211. The insulating patterns 215 may include a first insulating layer 213 and a second insulating layer 214 which are sequentially stacked. The insulating patterns 215 may be formed via thin-film formation processes and a patterning process. Each of the first insulating layer 213 and the second insulating layer 214 may include, for example, silicon oxide, silicon nitride, silicon oxynitride, or a combination thereof.

Figure 25A:
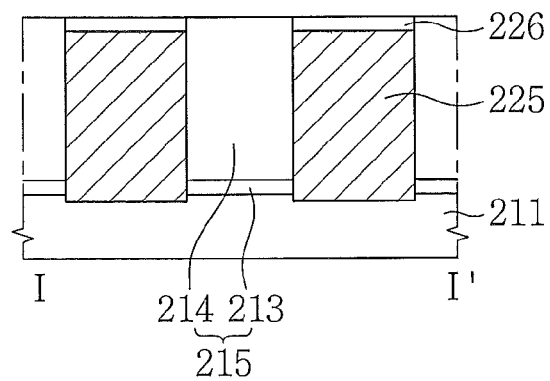

Referring to FIG. 25A, word lines 225 and first blocking layers 226 may be sequentially formed on the semiconductor substrate 211 to fill the grooves 215G. Bottoms of the word lines 225 may be formed at a lower level than the upper surface of the semiconductor substrate 211. The word lines 225 may be a semiconductor layer formed using an SEG process or a solid phase epitaxial growth process. The word lines 225 may include second conductivity-type impurities.

The first blocking layers 226 and the word lines 225 may be formed using an in-situ process. The first blocking layers 226 may be formed along upper surfaces of the word lines 225. The first blocking layers 226 may be a semiconductor layer containing a different element from the word lines 225. The first blocking layers 226 may include carbon, germanium, or a combination thereof. For example, the first blocking layers 226 may be single crystalline silicon containing carbon. The first blocking layers 226 may be single crystalline silicon containing the second conductivity-type impurities and carbon.

Figure 25B:
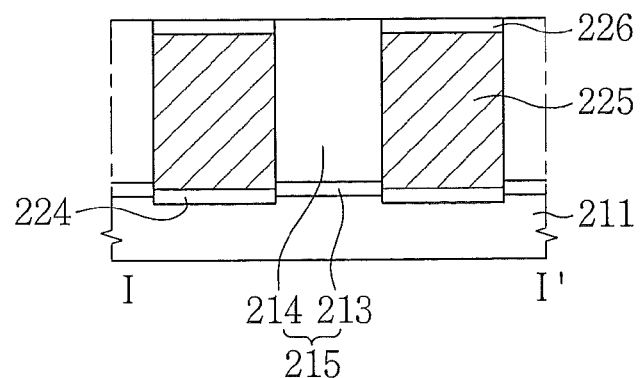

As shown in FIG. 25B, in alternative embodiments, third blocking layers 224 may be formed on the bottoms of the grooves 215G before the word lines 225 are formed. The word lines 225 and the first blocking layers 226 may be sequentially formed on the third blocking layers 224. The word lines 225 may be in contact with the third blocking layers 224. The third blocking layers 224 may be interposed between the word lines 225 and the semiconductor substrate 211. The third blocking layers 224, the word lines 225, and the first blocking layers 226 may be formed using an in-situ process. Bottoms of the third blocking layers 224 may be formed at a lower level than the upper surface of the semiconductor substrate 211.

The third blocking layers 224 may include carbon, germanium, or a combination thereof. The third blocking layers 224 may be a semiconductor layer formed using an SEG process or a solid phase epitaxial growth process. For example, the third blocking layers 224 may be single crystalline silicon using an SEG process. The third blocking layers 224 may be single crystalline silicon containing carbon. The third blocking layers 224 may be single crystalline silicon containing second conductivity-type impurities and carbon.

Figure 26A:
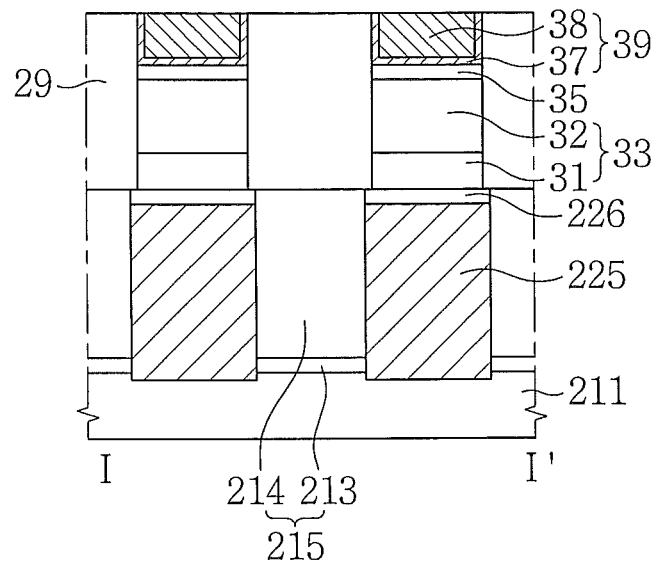

Referring to FIG. 26A, an interlayer insulating layer 29 may be formed on the first blocking layers 226 and the insulating patterns 215 of the embodiment of FIG. 25A. Switching devices 33 may be formed that extend through the interlayer insulating layer 29 to be in contact with the first blocking layers 226. Each of the switching devices 33 may include a first semiconductor pattern 31 and a second semiconductor pattern 32 which are sequentially stacked. Metal silicide patterns 35 may be formed on the switching devices 33. Lower pads 39 may be formed on the metal silicide patterns 35. Each of the lower pads 39 may include a first barrier metal pattern 37 and a conductive pattern 38 which is formed within a recess in the first barrier metal pattern.

Figure 26B:
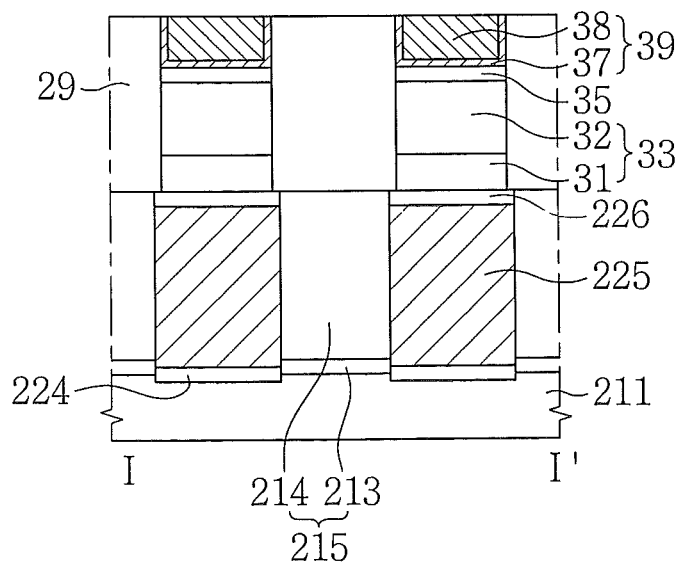

As shown in FIG. 26B, in the alternative embodiment discussed above with respect to FIG. 25B, third blocking layers 224 are formed between the semiconductor substrate 211 and the word lines 225 before the word lines 225 are formed. The word lines 225 and the first blocking layers 226 may be sequentially formed on the third blocking layers 224. The same layers may then be formed on this device that are formed on the embodiment of FIG. 26A in the manner described above.

Figure 26C:
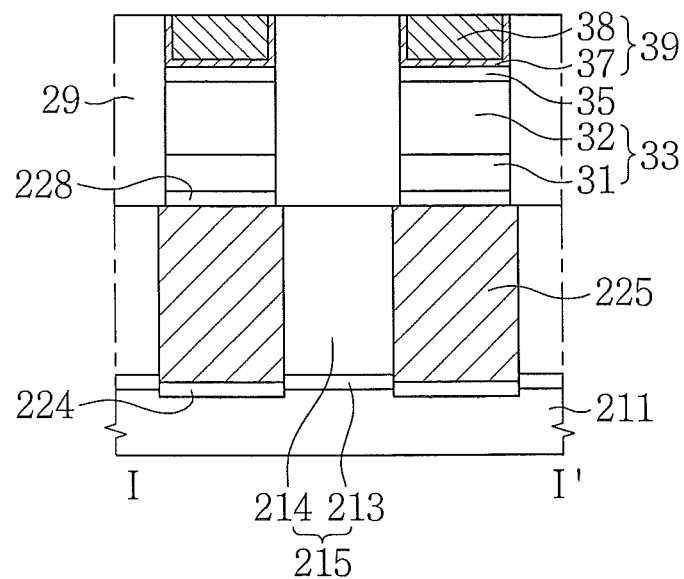

As shown in FIG. 26C, in another alternative embodiment, third blocking layers 224 are formed between the semiconductor substrate 211 and the word lines 225 and fourth blocking layers 228 are formed on the word lines 225 before the first semiconductor patterns 31 are formed. The fourth blocking layers 228 may be in contact with the word lines 225 and the first semiconductor patterns 31. In this embodiment, the first blocking layers 226 are omitted.

Figure 26D:
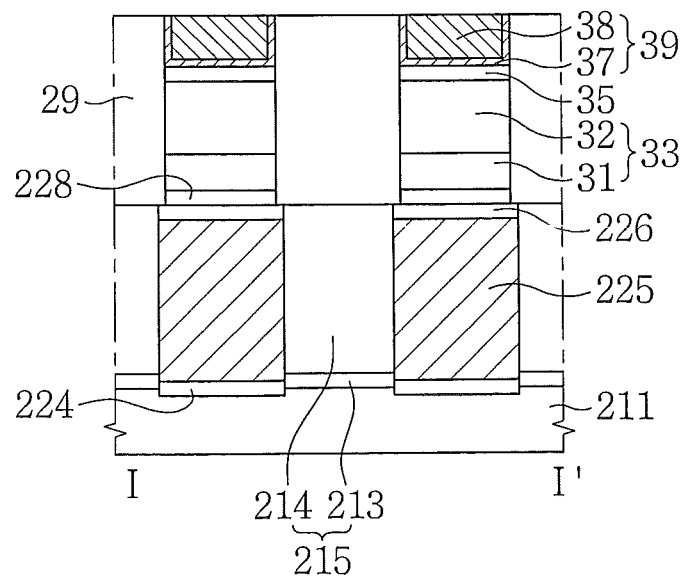

As shown in FIG. 26D, in still other embodiments the third blocking layers 224, the first blocking layers 226 and the fourth blocking layers 228 may all be formed.

Figure 27:
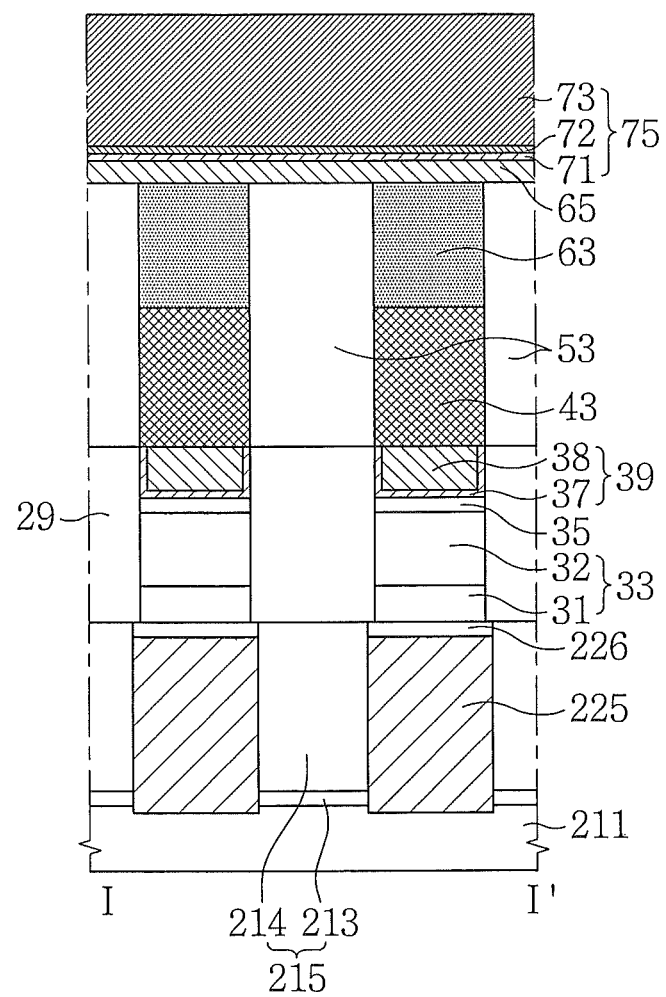

Referring to FIGS. 9 and 27, an upper insulating layer 53 may be formed on the interlayer insulating layer 29 and the lower pads 39. Data storage elements 47 and 63 may be formed to extend through the upper insulating layer 53 to be in contact with the lower pads 39. Each of the data storage elements 47 and 63 may include an electrode structure 47 and a phase-change pattern 63 disposed on the electrode structure 47. The electrode structure 47 may include a lower electrode 43 and a resistive pattern 44. An upper electrode 65 that is in contact with the phase-change patterns 63 may be formed on the upper insulating layer 53. A bit line 75 may be formed on the upper electrode 65. The bit line 75 may include a second barrier metal pattern 71, a seed layer 72, and a bit line conductive layer 73.

FIGS. 28A to 32 are cross-sectional views taken along line I-I' of FIG. 17 that illustrate methods of fabricating semiconductor devices in accordance with further embodiments of the inventive concept.

Figure 28A:
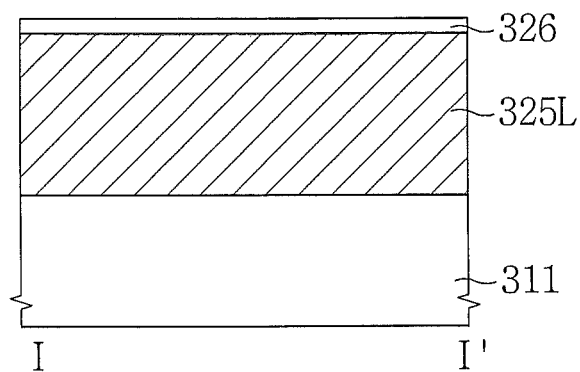

Referring to FIG. 28A, a lower conductive layer 325L and a first blocking layer 326 may be sequentially formed on a semiconductor substrate 311. The lower conductive layer 325L may be a semiconductor layer formed using an SEG process or a solid phase epitaxial growth process. The lower conductive layer 325L may include the second conductivity-type impurities. For example, the lower conductive layer 325L may be single crystalline silicon containing phosphorous.

The first blocking layer 326 and the lower conductive layer 325L may be formed using an in-situ process. The first blocking layer 326 may be a semiconductor layer formed using an SEG process or a solid phase epitaxial growth process. The first blocking layers 326 may be single crystalline silicon containing carbon. The first blocking layers 326 may be single crystalline silicon containing the second conductivity-type impurities and carbon.

Figure 28B:
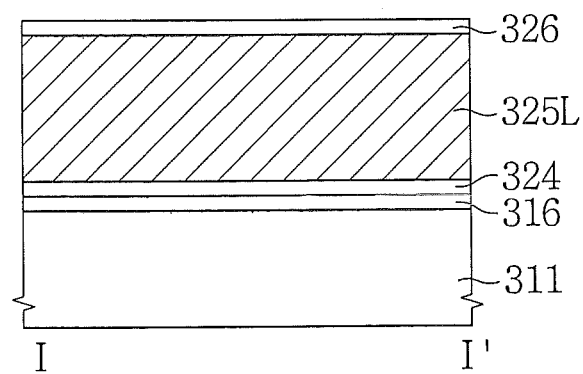

As shown in FIG. 28B, in an alternative embodiment a second blocking layer 316 and/or a third blocking layer 324 may be sequentially formed on the semiconductor substrate 311 before the lower conductive layer 325L is formed. The first blocking layer 326 may be formed on the lower conductive layer 325L. The second blocking layer 316 may be formed on the semiconductor substrate 311 by an ion-implantation process. The second blocking layer 316 may include carbon, germanium, or a combination thereof. For example, the second blocking layer 316 may be single crystalline silicon containing first conductivity-type impurities and carbon.

The third blocking layer 324, the lower conductive layer 325L, and the first blocking layer 326 may be formed using an in-situ process. The third blocking layer 324 may include carbon, germanium, or a combination thereof. The third blocking layer 324 may be a semiconductor layer formed using an SEG process or a solid phase epitaxial growth process. For example, the third blocking layer 324 may be single crystalline silicon containing carbon. The third blocking layer 324 may be single crystalline silicon containing second conductivity-type impurities and carbon. The third blocking layer 324 may be in contact with the second blocking layer 316.

Figure 29A:
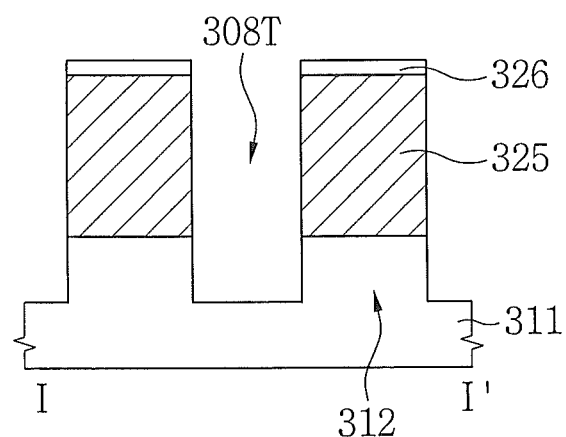

Referring to FIG. 29A, the lower conductive layer 325L may be patterned to form word lines 325. The first blocking layer 326 may be retained on the word lines 325. Trenches 308T may be formed between the word lines 325. Bottoms of the trenches 308T may be formed at a lower level than an upper surface of the semiconductor substrate 311. Active regions 312 may be defined between the trenches 308T. The active regions 312, the word lines 325, and the first blocking layer 326 may have substantially the same horizontal width.

Figure 29B:
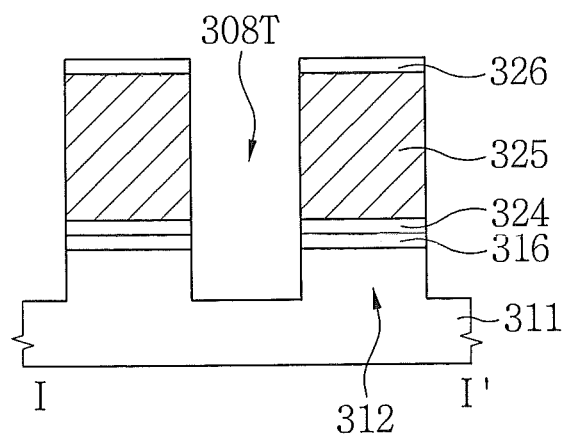

As shown in FIG. 29B, the same processing steps may be applied to the alternative embodiment of FIG. 28B. In this embodiment, the second blocking layer 316 and the third blocking layer 324 may be retained between the active regions 312 and the word lines 325. The active regions 312, the second blocking layer 316, the third blocking layer 324, the word lines 325, and the first blocking layer 326 may have substantially the same horizontal width.

Figure 30A:
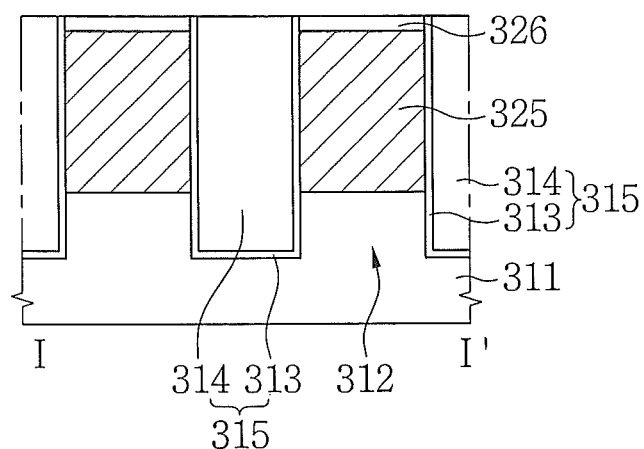
Figure 30B:
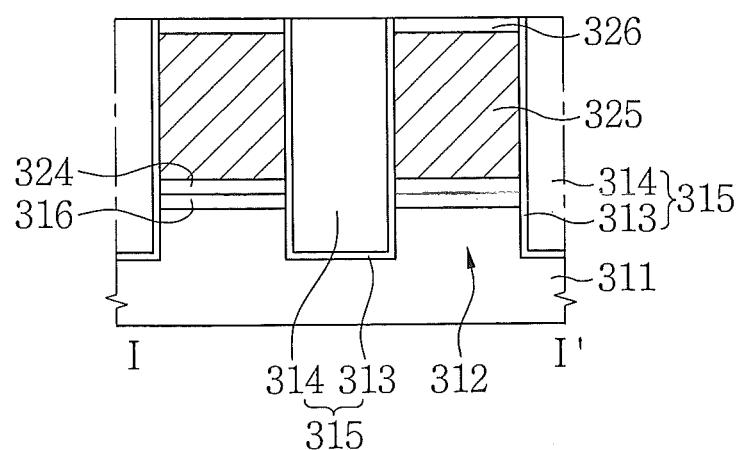

Referring to FIGS. 30A and 30B, insulating patterns 315 may be formed in the trenches 308T of each of the above-described embodiments. The insulating patterns 315 may include a first insulating layer 313 and a second insulating layer 314. The insulating patterns 315 may be formed via a thin-film formation process and a planarization process.

Figure 31A:
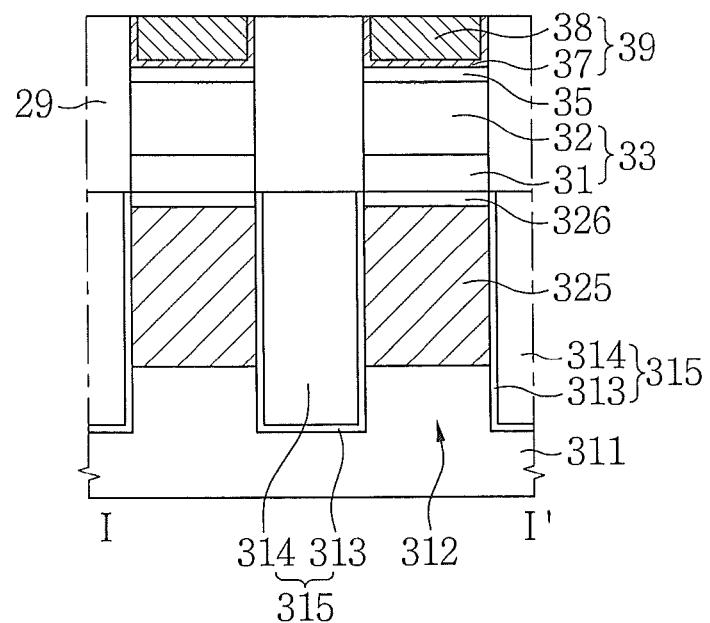

Referring to FIG. 31A, an interlayer insulating layer 29 may be formed on the first blocking layers 326 and the insulating patterns 315. Switching devices 33 may be formed that extend through the interlayer insulating layer 29 to be in contact with the first blocking layers 326. Each of the switching devices 33 may include a first semiconductor pattern 31 and a second semiconductor pattern 32 which are sequentially stacked. Metal silicide patterns 35 may be formed on the switching devices 33. Lower pads 39 may be formed on the metal silicide patterns 35. Each of the lower pads 39 may include a first barrier metal pattern 37 and a conductive pattern 38.

Figure 31B:
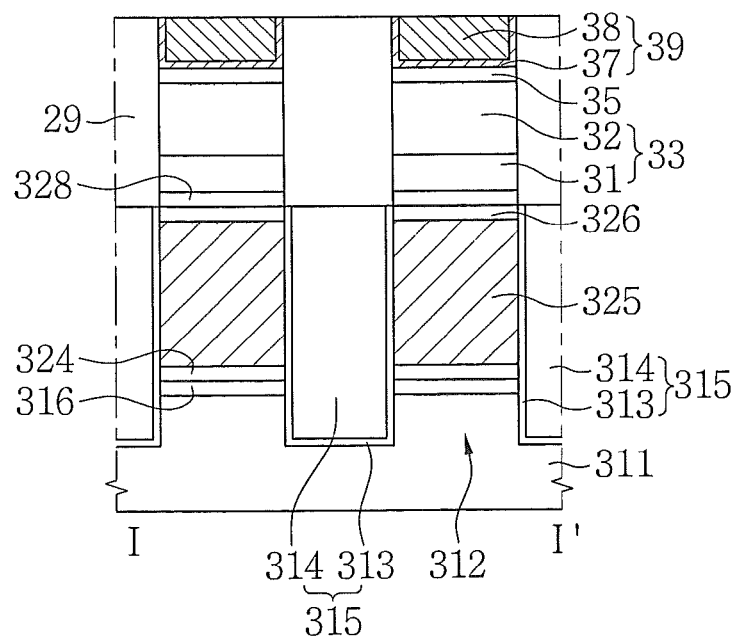

As shown in FIG. 31B, in an alternative embodiment, fourth blocking layers 328 may be formed on the first blocking layers 326 before the first semiconductor patterns 31 are formed.

Figure 32:
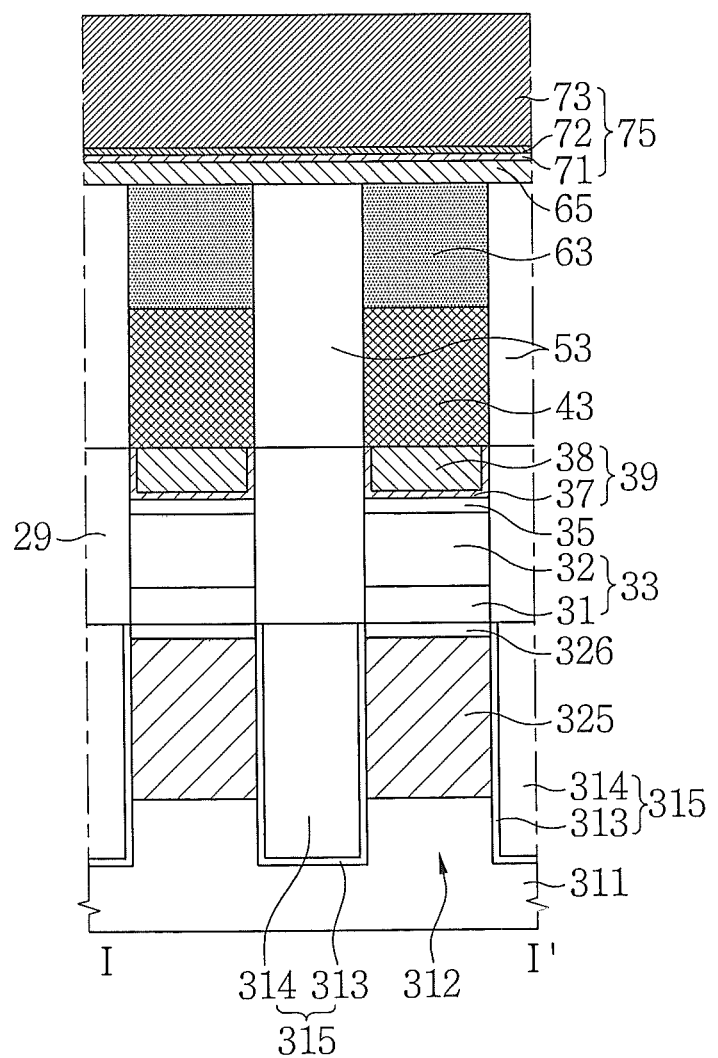

Referring to FIGS. 14 and 32, an upper insulating layer 53 may be formed on the interlayer insulating layer 29 and the lower pads 39. Data storage elements 47 and 63 may be formed that extend through the upper insulating layer 53 to connect to the lower pads 39. Each of the data storage elements 47 and 63 may include an electrode structure 47 and a phase-change pattern 63 on the electrode structure 47. The electrode structure 47 may include a lower electrode 43 and a resistive pattern 44. An upper electrode 65 that is in contact with the phase-change patterns 63 may be formed on the upper insulating layer 53. A bit line 75 may be formed on the upper electrode 65. The bit line 75 may include a second barrier metal pattern 71, a seed layer 72, and a bit line conductive layer 73.

Figure 33:
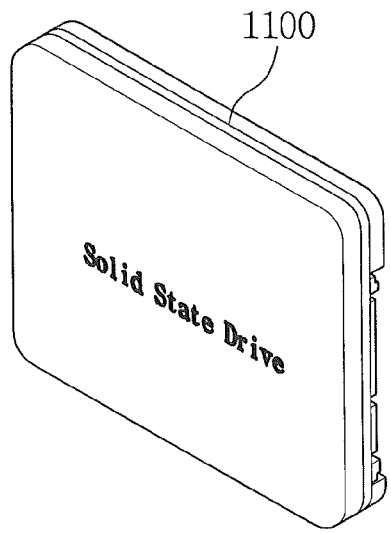
FIGS. 33 to 38 are perspective views and block diagrams illustrating electronic devices in accordance with embodiments of the inventive concept.
Figure 34:
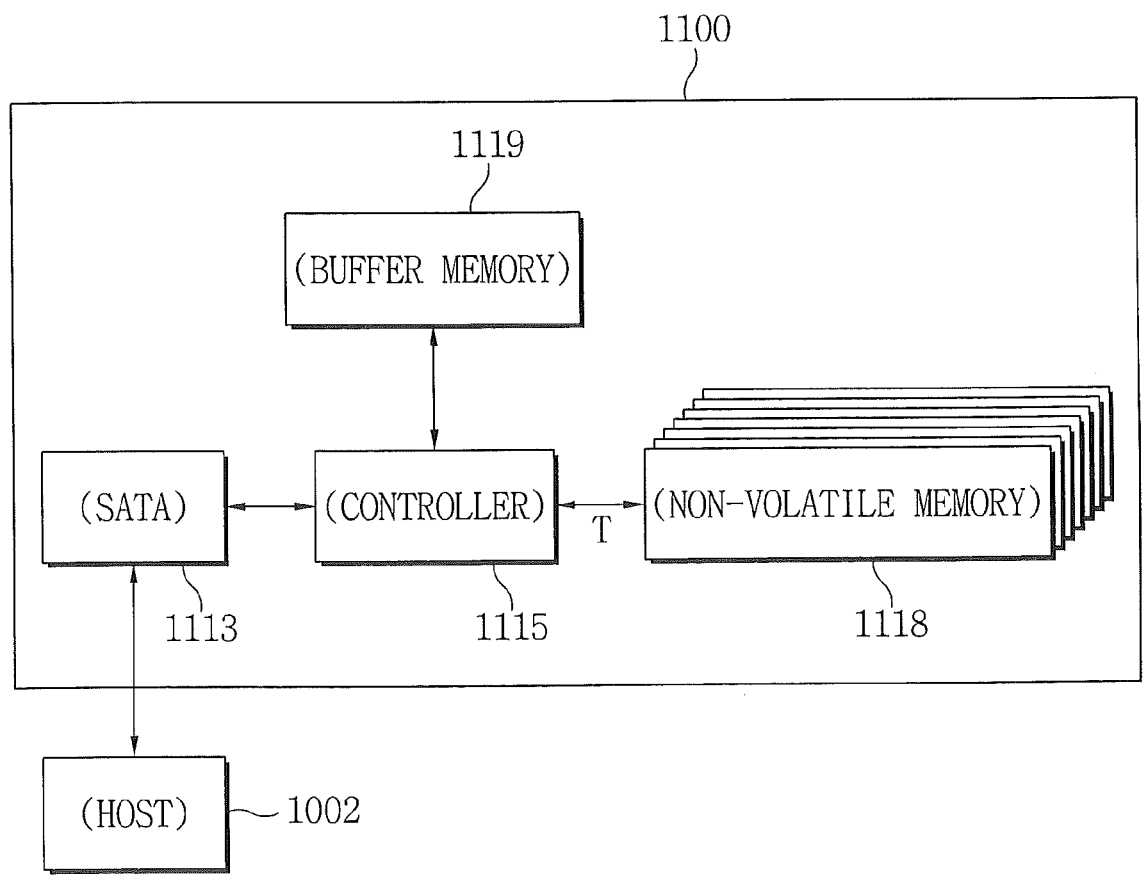

FIG. 33 is a perspective view showing an electronic apparatus in accordance with embodiments of the inventive concept, and FIG. 34 is a system block diagram of an electronic apparatus in accordance with embodiments of the inventive concept. The electronic apparatus may be a data storage device, such as a solid state drive (SSD) 1100.

Referring to FIGS. 33 and 34, the SSD 1100 may include an interface 1113, a controller 1115, a non-volatile memory 1118, and a buffer memory 1119. The SSD 1100 may be an apparatus that stores information using a semiconductor device. The SSD 1100 is faster, has a lower mechanical delay or failure rate, and generates less heat and noise than a hard disk drive (HDD). Further, the SSD 1100 may be smaller and lighter than the HDD. The SSD 1100 may be widely used in a laptop computer, a netbook, a desktop PC, an MP3 player, or a portable storage device.

The controller 1115 may be formed close to the interface 1113 and electrically connected thereto. The controller 1115 may be a microprocessor including a memory controller and a buffer controller. The non-volatile memory 1118 may be formed close to the controller 1115 and electrically connected thereto. Data storage capacity of the SSD 1100 may correspond to the capacity of the non-volatile memory 1118. The buffer memory 1119 may be formed close to the controller 1115 and electrically connected thereto.

The interface 1113 may be connected to a host 1002, and may send and receive electrical signals, such as data. For example, the interface 1113 may be a device using a standard such as a Serial Advanced Technology Attachment (SATA), an Integrated Drive Electronics (IDE), a Small Computer System Interface (SCSI), and/or a combination thereof. The non-volatile memory 1118 may be connected to the interface 1113 via the controller 1115. The non-volatile memory 1118 may function to store data received through the interface 1113. Even when power supplied to the SSD 1100 is interrupted, the data stored in the non-volatile memory 1118 may be retained.

The buffer memory 1119 may include a volatile memory. The volatile memory may be a dynamic random access memory (DRAM) and/or a static random access memory (SRAM). The buffer memory 1119 has a relatively faster operating speed than the non-volatile memory 1118.

Data processing speed of the interface 1113 may be relatively faster than the operating speed of the non-volatile memory 1118. Here, the buffer memory 1119 may function to temporarily store data. The data received through the interface 1113 may be temporarily stored in the buffer memory 1119 via the controller 1115, and then permanently stored in the non-volatile memory 1118 according to the data write speed of the non-volatile memory 1118. Further, frequently-used items of the data stored in the non-volatile memory 1118 may be pre-read and temporarily stored in the buffer memory 1119. That is, the buffer memory 1119 may function to increase effective operating speed of the SSD 1100, and to reduce an error rate thereof.

The non-volatile memory 1118 may have a configuration as described with reference to FIGS. 1 to 32. For example, the non-volatile memory 1118 may include the word line 25 and the first blocking layer 26 in FIG. 1. The storage capacity of the SSD 1100 may increase, and electrical properties may be significantly improved than in the related art, while the size of the SSD 1100 is reduced.

Figure 35:
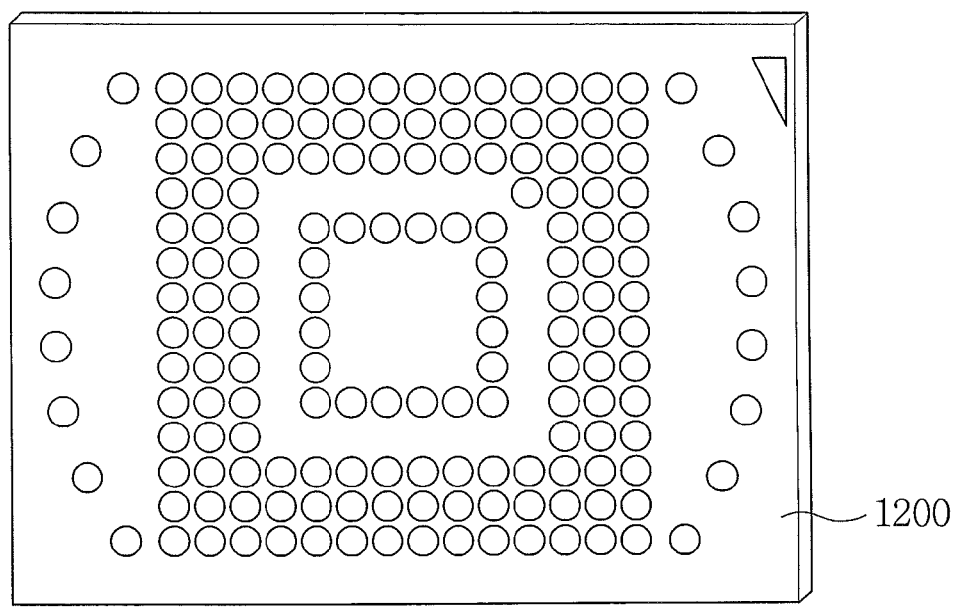
Figure 36:
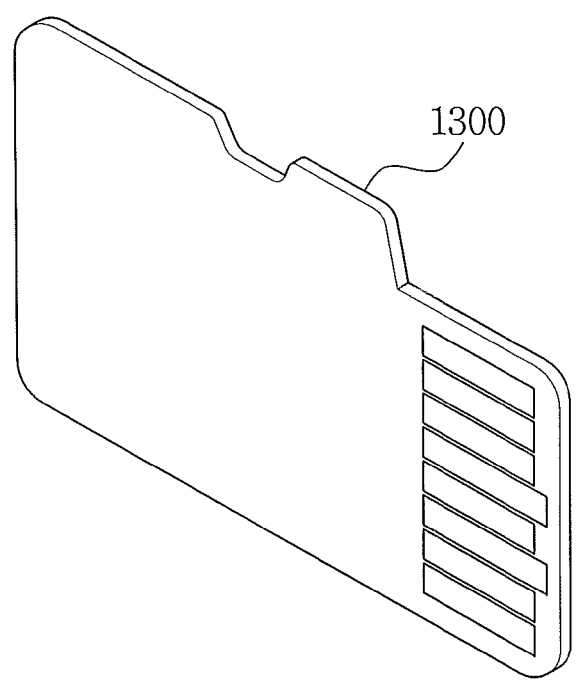
Figure 37:
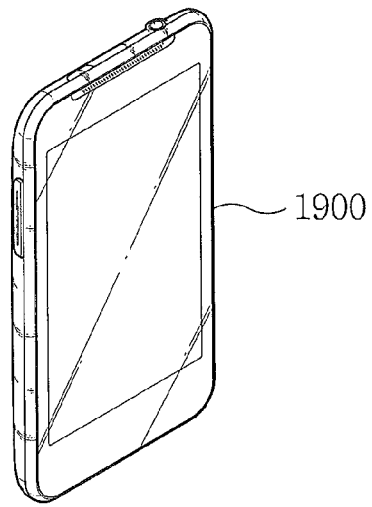
Figure 38:
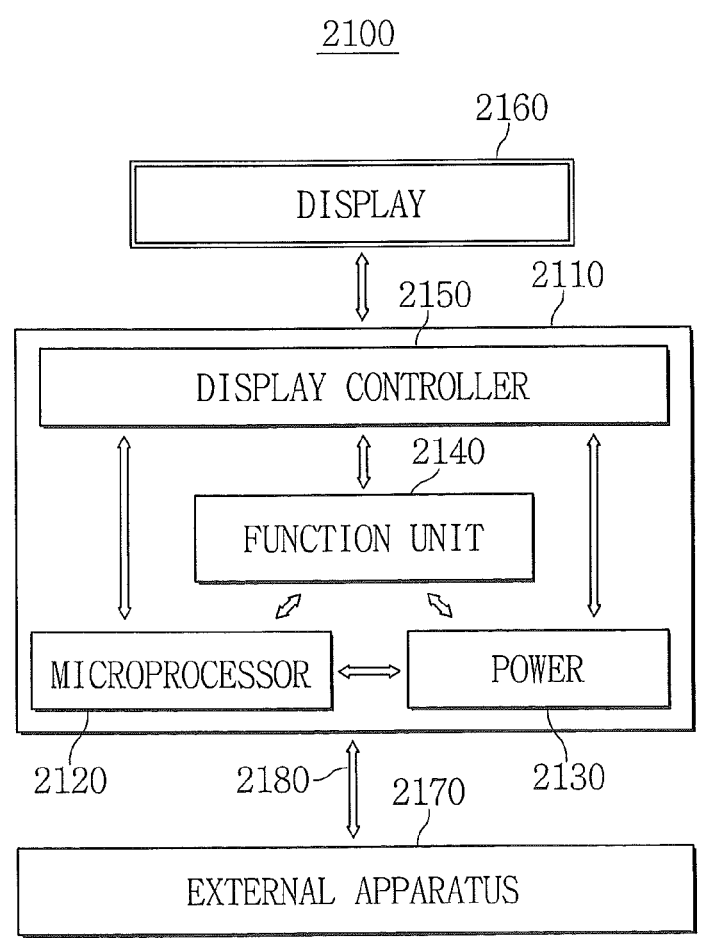

FIGS. 35 to 37 are perspective views showing electronic apparatuses in accordance with embodiments of the inventive concept, and FIG. 38 is a system block diagram of electronic apparatuses in accordance with embodiments of the inventive concept.

Referring to FIGS. 35 to 37, the semiconductor device described with reference to FIGS. 1 to 32 may be usefully applied to electronic systems, such as an embedded multimedia chip (eMMC) 1200, a micro SD 1300, a smart phone 1900, a netbook, a laptop computer, or a tablet PC. For example, the semiconductor device as described with reference to FIGS. 1 to 32 may be installed in a mainboard of the smart phone 1900. The semiconductor device as described with reference to FIGS. 1 to 32 may be provided to an expansion apparatus, such as the micro SD 1300, to be used in combination with the smart phone 1900.

Referring to FIG. 38, the semiconductor device as described with reference to FIGS. 1 to 32 may be applied to an electronic system 2100. The electronic system 2100 may include a body 2110, a microprocessor unit 2120, a power unit 2130, a function unit 2140, and a display controller unit 2150. The body 2110 may be a motherboard formed of a printed circuit board (PCB). The microprocessor unit 2120, the power unit 2130, the function unit 2140, and the display controller unit 2150 may be installed on the body 2110. A display unit 2160 may be arranged inside or outside of the body 2110. For example, the display unit 2160 may be arranged on a surface of the body 2110 and display an image processed by the display controller unit 2150.

The power unit 2130 may receive a constant voltage from an external battery (not shown), etc., divide the voltage into various levels, and supply those voltages to the microprocessor unit 2120, the function unit 2140, and the display controller unit 2150, etc. The microprocessor unit 2120 may receive a voltage from the power unit 2130 to control the function unit 2140 and the display unit 2160. The function unit 2140 may perform various functions of the electronic system 2100. For example, when the electronic system 2100 is a mobile phone, the function unit 2140 may have several components which perform functions of the mobile phone such as output of an image to the display unit 2160 or output of a voice to a speaker, by dialing or communication with an external apparatus 2170. If a camera is installed, the function unit 2140 may function as a camera image processor.

In the embodiment to which the inventive concept is applied, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. In addition, when the electronic system 2100 needs a universal serial bus (USB), etc. in order to expand functionality, the function unit 2140 may function as an interface controller. Further, the function unit 2140 may include a mass storage apparatus.

The semiconductor device as described with reference to FIGS. 1 to 32 may be applied to the function unit 2140 or the microprocessor unit 2120. For example, the function unit 2140 may include the word line 25 and the first blocking layer 26 in FIG. 1. The word line 25 in FIG. 1 may be electrically connected to the body 2110. The electronic system 2100 may be favorable to be light, thin, short, and small, and have better electrical characteristics.

According to the embodiments of the inventive concept, a semiconductor device having a word line, blocking layer, and switching device may be provided. The word line may be a semiconductor layer formed using a selective epitaxial growth (SEG) process or a solid phase epitaxial growth process. The word line may include n-type impurities. The diffusion rate of the n-type impurities in the word line into the semiconductor substrate may be significantly lower compared to the related art. The size of the word line may be reduced while current driving capability increases. The blocking layer may function to prevent the n-type impurities in the word line from diffusing into the switching device. The vertical height of the switching device may be reduced, and electrical characteristics may be significantly improved compared to the related art. A semiconductor device favorable for high integration and having superior electrical characteristics to the related art may be implemented.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor device, comprising:
a substrate having first conductivity-type impurities;
a lower interconnection on the substrate and having second conductivity-type impurities;
a switching device on the lower interconnection;
a semiconductor blocking layer between the substrate and the lower interconnection, the semiconductor blocking layer having the same horizontal width as the lower interconnection; and
an additional blocking layer that includes carbon (C) and/or germanium (Ge) between the lower interconnection and the switching device,
wherein the semiconductor blocking layer comprises:
a lower blocking layer in contact with an active region in the substrate and having the first conductivity-type impurities; and
an upper blocking layer in contact with the lower interconnection and having the second conductivity-type impurities, and
wherein the additional blocking layer comprises
a lower additional blocking layer in contact with the lower interconnection; and
an upper additional blocking layer in contact with the lower additional blocking layer,
wherein a width of the lower additional blocking layer exceeds a width of the upper additional blocking layer, wherein the semiconductor blocking layer comprises a silicon layer that is doped with first conductivity-type impurities and carbon (C), germanium (Ge), or a combination thereof.

2. The semiconductor device of claim 1, further comprising:
a data storage element on the switching device; and
an upper interconnection on the data storage element.

3. The semiconductor device of claim 1, wherein a height of the lower interconnection exceeds a width of the lower interconnection.

4. The semiconductor device of claim 1, wherein the lower interconnection is on the active region, the active region protrudes from the substrate, and wherein the lower interconnection has a width that exceeds a width of the active region.

5. The semiconductor device of claim 1, wherein the switching device comprises:
a first semiconductor pattern having second conductivity-type impurities that is in direct contact with the upper additional blocking layer; and
a second semiconductor pattern on the first semiconductor pattern,
wherein a first concentration of the second conductivity-type impurities in the first semiconductor pattern is lower than a second concentration of the second conductivity-type impurities in the lower interconnection.

6. The semiconductor device of claim 5, wherein the upper additional blocking layer has the same horizontal width as the first semiconductor pattern.

* * * * *